(12) United States Patent
Austin et al.

(10) Patent No.: US 8,560,574 B2
(45) Date of Patent: Oct. 15, 2013

(54) APPARATUS AND DEPENDENCY STRUCTURE MATRIX FOR ASSISTING IN OPTIMIZATION OF A COMPLEX, HIERARCHICAL DATA STRUCTURE

(75) Inventors: Simon Anthony Austin, Leicestershire (GB); Paul Richard Waskett, Leicestershire (GB); Andrew Noel Baldwin, Leicestershire (GB); John Leslie Steele, Leicestershire (GB)

(73) Assignee: Loughborough University Innovations, Ltd., Loughborough (GB)

( * ) Notice: Subject to any disclaimer, the term of this patent is extended or adjusted under 35 U.S.C. 154(b) by 1544 days.

(21) Appl. No.: 10/380,663

(22) PCT Filed: Sep. 10, 2001

(86) PCT No.: PCT/GB01/04056
§ 371 (c)(1),
(2), (4) Date: Jul. 21, 2003

(87) PCT Pub. No.: WO02/23371
PCT Pub. Date: Mar. 21, 2002

(65) Prior Publication Data
US 2004/0034662 A1 Feb. 19, 2004

(30) Foreign Application Priority Data
Sep. 11, 2000 (GB) .................................. 0022189.5

(51) Int. Cl.
*G06F 7/00* (2006.01)
*G06F 17/30* (2006.01)

(52) U.S. Cl.
USPC ......................................... 707/793; 707/803

(58) Field of Classification Search
USPC ..................... 707/101, 103 R, 102, 793, 803
See application file for complete search history.

(56) References Cited

U.S. PATENT DOCUMENTS

| | | | | |
|---|---|---|---|---|
| 5,255,356 A | * | 10/1993 | Michelman et al. | 715/504 |
| 5,745,390 A | * | 4/1998 | Daneshgari | 702/119 |
| 6,028,602 A | * | 2/2000 | Weidenfeller et al. | 715/781 |
| 6,185,582 B1 | * | 2/2001 | Zellweger et al. | 715/503 |
| 6,334,182 B2 | * | 12/2001 | Merchant et al. | 712/214 |

OTHER PUBLICATIONS

Siller, J. "A Planning and Design Technique." IBM Technical Disclosure Bulletin, Nov. 1974, pp. 1791-1794.*
Browning, Tyson R. "Use of Dependency Structure Matrices for Product Development Cycle Time Reduction." Proceedings of the 5th ISPE Intl. Conference on Concurrent Engineering: Research and Applications, Tokyo, Japan, Jul. 15-17, 1998.*

(Continued)

*Primary Examiner* — Charles Lu
(74) *Attorney, Agent, or Firm* — Haugen Law Firm PLLP

(57) ABSTRACT

A method and apparatus for assisting in the optimization of a complex, hierarchical data structure, such as a process flow model, comprising a plurality of elements such as tasks to be carried out, each element having data dependency upon other elements within the hierarchy. The apparatus includes a database for maintaining a data set incorporating a plurality of dependency structure matrices, each dependency structure matrix corresponding to one hierarchical level in the data set; display means for displaying, to the user, a representation of said dependency structure matrices; user input means for effecting the change of a data dependency of a selected element at a selected level in said hierarchy; and data manipulation means for effecting consequential changes in the data set representing said changes in dependency of elements throughout the hierarchical structure.

33 Claims, 23 Drawing Sheets

(56) References Cited

OTHER PUBLICATIONS

Browning, Tyson R. "Applying the Design Structure Matrix to System Decomposition and Integration Problems: A Review and New Directions." IEEE Transactions on Engineering Management, vol. 48, No. 3, Aug. 2001.*

Rask et al. "Design Structure Matrices for the Planning of Rule-Based Engineering Systems." Changing the Ways We Work, IOS Press, 1998. pp. 349-358.*

"Application of the Analytical Design Planning Technique to Construction Project Management" Simon Austin et al. Project Management Institute (2000) vol. 31, No. 2, pp. 48-59.

"Product Development Process Capture and Display Using Web-Based Technologies" Nader Sabbaghian et al. Massachusetts Institute of Technology (1998) pp. 2664-2669.

"Systems Analysis and Management: Structure, Strategy and Design" Donald V. Steward California State University, Sacramento, Chapter 3, pp. 40-60, and Chapter 4, pp. 67-77.

* cited by examiner

| Task No | Description | Duration | Week 1 | Week 2 | Week 3 | Week 4 | Week 5 |
|---|---|---|---|---|---|---|---|
| A.3 | Task 3 | 2 days | | | | | |
| A.7 | Task 7 | 4 days | | | | | |
| A.1 | Task 1 | 2 days | | | | | |
| A.8 | Task 8 | 5 days | | | | | |
| A.11 | Task 11 | 3 days | | | | | |
| A.6 | Task 6 | 5 days | | | | | |
| A.9 | Task 9 | 4 days | | | | | |
| A.4 | Task 4 | 2 days | | | | | |
| A.5 | Task 5 | 4 days | | | | | |
| A.10 | Task 10 | 1 day | | | | | |
| A.12 | Task 12 | 3 days | | | | | |
| A.2 | Task 2 | 4 days | | | | | |

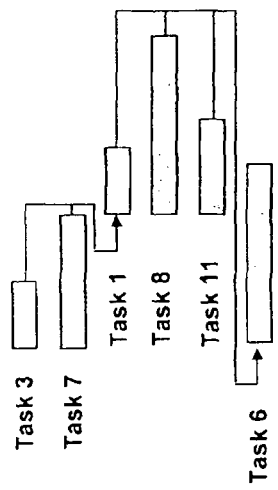

Fig. 23

Fig. 24

US 8,560,574 B2

APPARATUS AND DEPENDENCY STRUCTURE MATRIX FOR ASSISTING IN OPTIMIZATION OF A COMPLEX, HIERARCHICAL DATA STRUCTURE

BACKGROUND

The present invention relates to software-based tools for automatically assisting in complex problem solving, in particular though not exclusively in which the problem solving represents design or design planning processes. The problem solving, or design/design planning processes may relate to a wide variety of industrial sectors, such as the design of a building, an automobile or other complex structure.

There are a number of methods and associated software tools available which assist a user to design and plan a number of independent and interdependent tasks or operations necessary to complete a complex undertaking, such as the design of a building. These methods and software tools generally assist or facilitate the scheduling of all the design and construction activities required in order to complete the complex undertaking.

In one previously described technique, an analytical design planning process comprises the steps as indicated in FIG. 1. With reference to FIG. 1, the first step is to generate a model 10 of the design process, which defines the activities and their information requirements. Various modelling techniques are known in the art, and examples of these are discussed in "Analytical Design Planning Technique: a model of the detailed building design process", S A Austin et al; *Design Studies*, Vol. 20, No. 3, April 1999, pp. 279-296.

From this model, a table 12 of activities is generated, listing the information requirements and dependencies of the individual activities, together with an indication of the classification of any such information dependencies. Next, a dependency structure matrix (DSM) analysis tool is linked to the model or table via a database or other file structure and identifies the optimal sequence of activities and iterations within the design process and displays them in a dependency structure matrix 14. Finally a programme or schedule of activities 16 is generated from the DSM. Further details of this analytical design planning technique are described in S A Austin et al: "Analytical design planning technique (ADePT): a dependency structure matrix tool to schedule the building design process"; *Construction Management and Economics*, Vol. 18, 2000, pp. 173-182; and S A Austin et al: "Analytical design planning for programming building design"; *Proc. Instn. Civ. Engrs Structures & Buildings*, Vol. 134, May 1999, pp. 111-118.

BRIEF SUMMARY

The present invention offers a significant improvement in the performance and capabilities of the foregoing analytical design planning tools by providing automated assistance to a user to greatly improve the dependency structure matrix analysis process. More generally, the present invention offers an improvement in automated analytical planning and problem solving tools that assist the user to greatly improve the dependency structure matrix analysis process.

According to one aspect, the present invention comprises an apparatus for assisting in the optimisation of a complex, hierarchical data structure comprising a plurality of elements each having data dependency upon other elements within the hierarchy, the apparatus comprising:
database means for maintaining a data set incorporating information relating to a plurality of dependency structure matrices, each dependency structure matrix corresponding to one or more hierarchical levels in the data set;
display means for displaying, to the user, a representation of said dependency structure matrices;
user input means for effecting the change of a data dependency of a selected element at a selected level in said hierarchy;
data manipulation means for effecting consequential changes in the data set representing said changes in dependencies of elements throughout the hierarchical structure.

According to another aspect, the present invention provides an apparatus for assisting in the optimisation of a complex, hierarchical data structure comprising a plurality of elements each having data dependency upon other elements within the hierarchy, the apparatus comprising:
database means for storing a data set representing a plurality of said elements each having a hierarchical position within the data structure and each having a data dependency upon other elements in the data structure;
display means for displaying, to a user, a plurality of dependency structure matrices in which each dependency structure matrix corresponds to elements in one or more hierarchical levels in the data structure;
data manipulation means for effecting changes in the data dependencies of elements throughout the hierarchical structure consequential upon at least one change effected in a dependency structure matrix at one hierarchical level; and
said display means displaying the effects of such changes in said plurality of displayed dependency structure matrices.

According to another aspect, the present invention provides a method of optimising a complex, hierarchical data structure comprising a plurality of elements each having data dependency upon other elements within the hierarchy, the method comprising:
maintaining a data set incorporating information relating to a plurality of dependency structure matrices, each dependency structure matrix corresponding to one or more hierarchical levels in the data set;
displaying to a user a representation of at least two of said dependency structure matrices;
effecting the change of a data dependency of a selected element at a selected level in said hierarchy;
manipulating the data set to effect consequential changes in the data set representative of said changes in dependencies of elements throughout the hierarchical structure;
displaying an updated representation of said at least two dependency structure matrices following said data set manipulation.

According to another aspect, the present invention provides a method for the optimisation of a complex, hierarchical data structure comprising a plurality of elements each having data dependency upon other elements within the hierarchy, the method comprising:
storing a data set representing a plurality of said elements each having a hierarchical position within the data structure and each having a data dependency upon other elements in the data structure;
displaying, to a user, a plurality of dependency structure matrices in which each dependency structure matrix corresponds to elements in one or more hierarchical levels in the data structure;

effecting changes in the data dependencies of elements throughout the hierarchical structure consequential upon at least one change effected in a dependency structure matrix at one hierarchical level; and displaying the effects of such changes in said plurality of displayed dependency structure matrices.

According to another aspect, the present invention provides an apparatus for assisting in the optimisation of a complex, hierarchical data structure comprising a plurality of elements each having data dependency upon other elements within the hierarchy, the apparatus comprising:

database means for maintaining a data set defining a dependency structure matrix of said plurality of elements at various hierarchical levels in the data structure;

display means for displaying, to the user, a representation of at least a selected portion of said dependency structure matrix, said selected portion comprising a plurality of elements from one or more of said hierarchical levels; and user input means for effecting a change in the portion selected for display comprising a graphical user interface list of elements each expandable to display subordinate elements at lower levels in the hierarchy or collapsible to hide subordinate elements at lower levels in the hierarchy, said display means being adapted to display a selected portion of the dependency structure matrix corresponding to elements currently displayed in said graphical user interface list of elements.

Embodiments of the present invention will now be described by way of example and with reference to the accompanying drawings in which:

BRIEF DESCRIPTION OF THE DRAWINGS

FIG. 3 shows examples of a dependency structure matrix suitable for use in the present invention;

FIGS. 22 to 24 show views of input and output viewing screens for selection of dependency structure matrix portions to which tearing algorithm operations are to be applied and results therefrom.

DETAILED DESCRIPTION

Figure 2A:
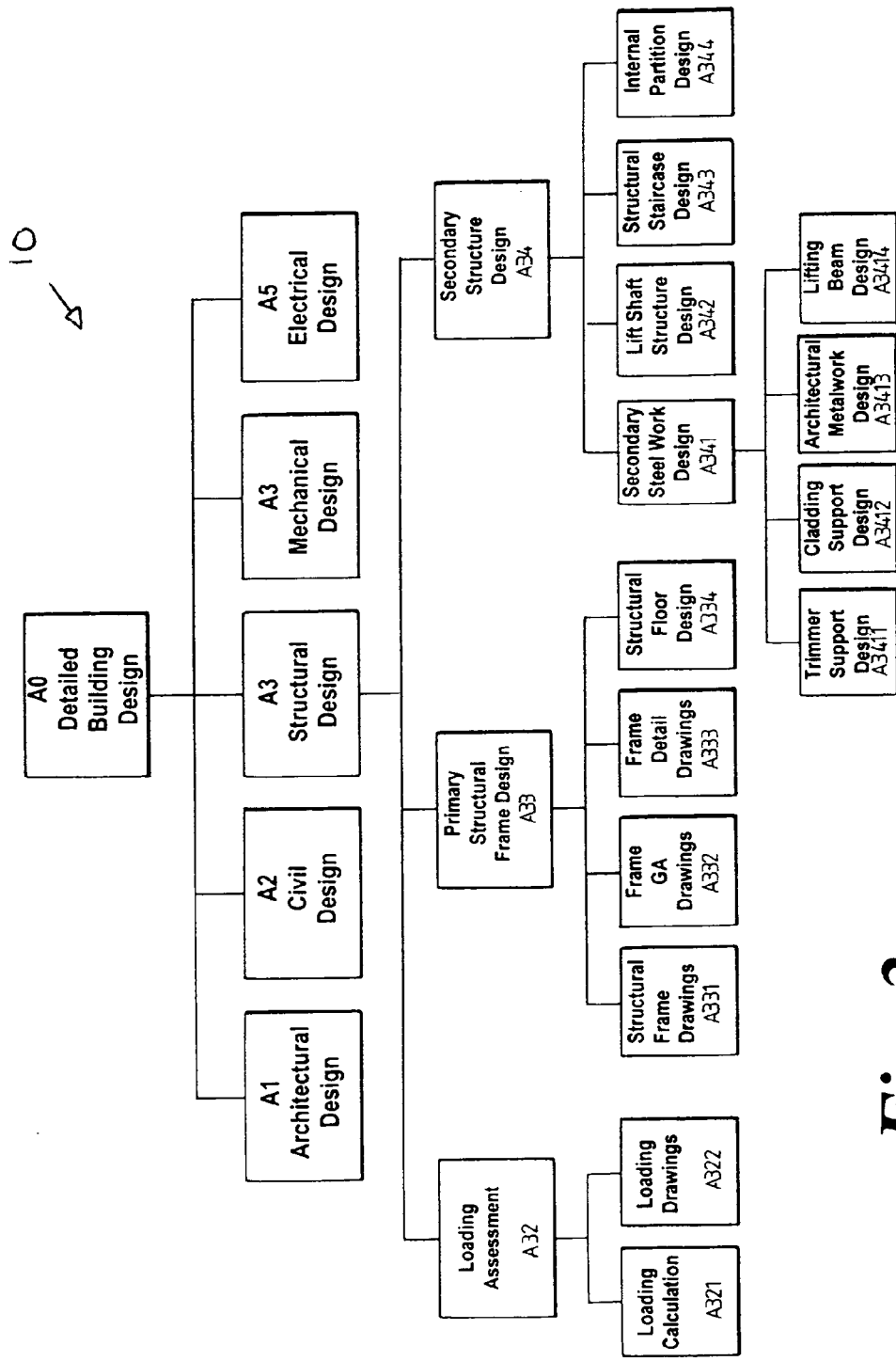
FIG. 2a shows a design process hierarchical model suitable for use in the design planning technique of FIG. 1.

With reference to FIG. 2a there is shown an exemplary process model 10 for a complex undertaking, namely the design of a substantial building. It can be seen that the design process model typically has a hierarchical structure, the process being divided into the design aspects undertaken by the various professional disciplines. In the example of building design and construction, these might include, eg. architecture, civil engineering, structural engineering, mechanical engineering and electrical engineering. As an example, the various sub-processes being carried out under the structural design process A3 are given as loading assessment (A32), primary structural frame design (A33) and secondary structural frame design (A34). Sub-processes are further split into further processes or tasks, as shown.

Figure 2B:
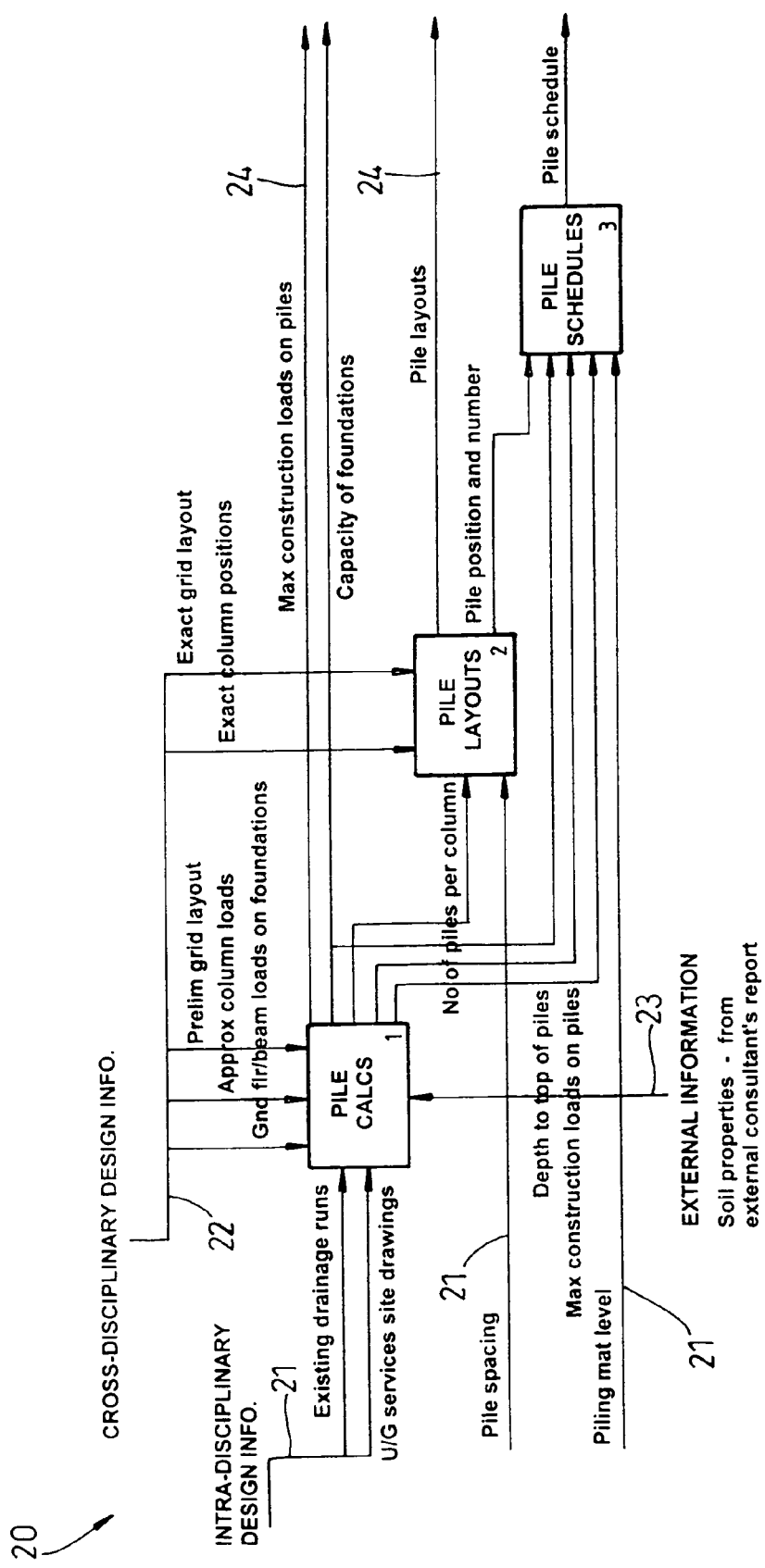
FIG. 2b shows a schematic diagram of part of a data flow diagram representing information flows in the design process model of FIG. 2a, suitable for use in the design planning technique of FIG. 1.

Each task or activity within the process model (more generally referred to as an element) typically requires information flows or results from other tasks or activities in the process model. These can be conveniently represented using a data flow diagram of the design process model. An example of a design process data flow diagram 20, showing process information flows, is given in FIG. 2b. In FIG. 2b, exemplary information flows for a part of the overall design process model 10 relating to lift shaft design are shown. This data flow diagram is an example of the IDEF0v notation of design process data flow diagram, where intradisciplinary inputs 21 enter from the left, cross-disciplinary inputs 22 enter from the top, inputs 23 from external sources enter from the bottom and output information 24 exits from the right.

Figure 1:
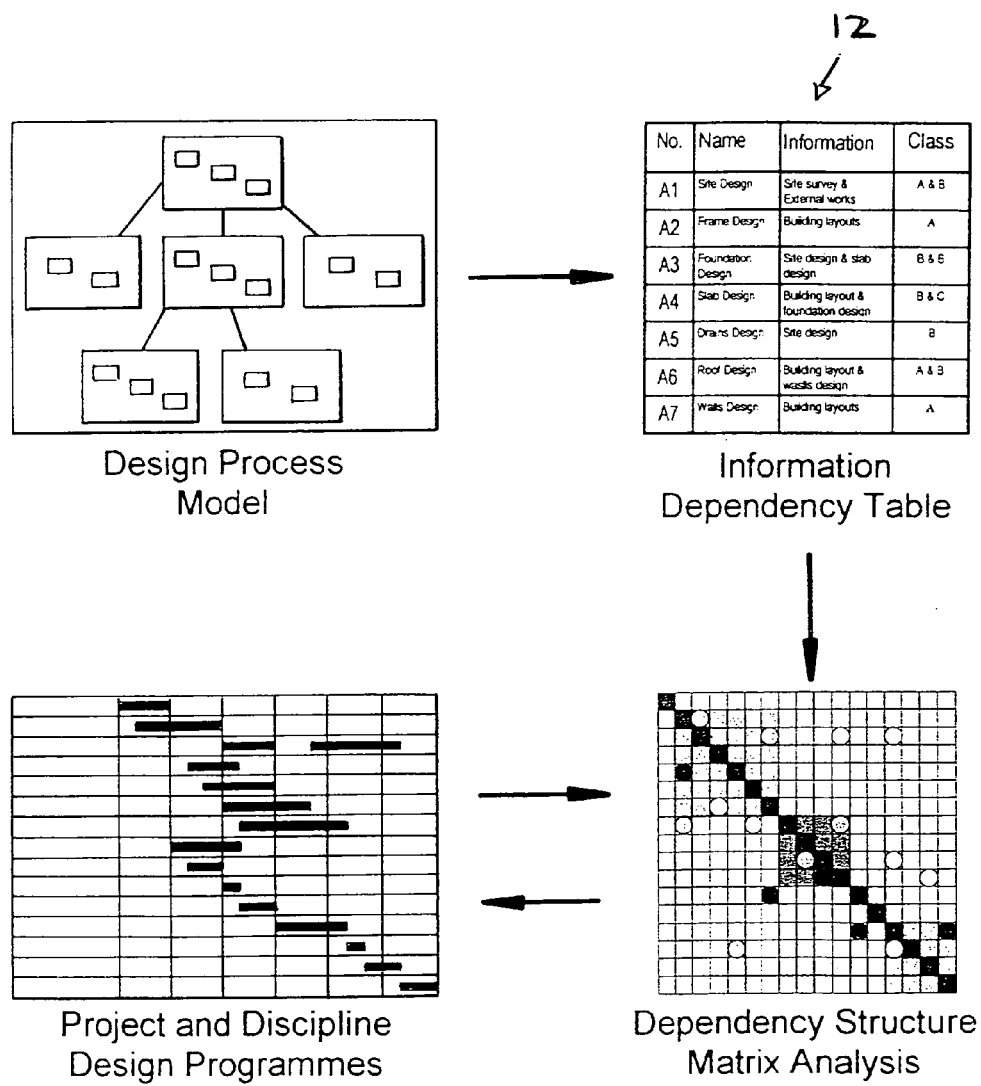
FIG. 1 shows a schematic diagram of the steps in a prior art analytical design planning technique.

It will be understood that other types of process diagrams 20 or other graphical representations of tasks and dependencies may be used in conjunction with the present invention to represent a hierarchical data structure comprising a plurality of elements. A characteristic of these diagrams is that dependencies of individual tasks can be shown. The dependencies may be then conveniently represented, preferably in the form of a dependency table 12, as shown in FIG. 1. The information dependency table of FIG. 1 basically comprises a list of tasks or activities in the process model and indicates the various information inputs required for the completion of that task.

Study of an information dependency table and design process data flow diagram shows that many complex loops and interrelated dependencies will become apparent in any complex undertaking, such as the design of a large building. Manually resolving these various interdependencies becomes a near impossible task in the design of complex undertakings and, in the present invention, a dependency structure matrix (DSM) 14 is automatically generated to assist in the refinement of the design to a workable solution.

Figures 3A, 3B, 3C:
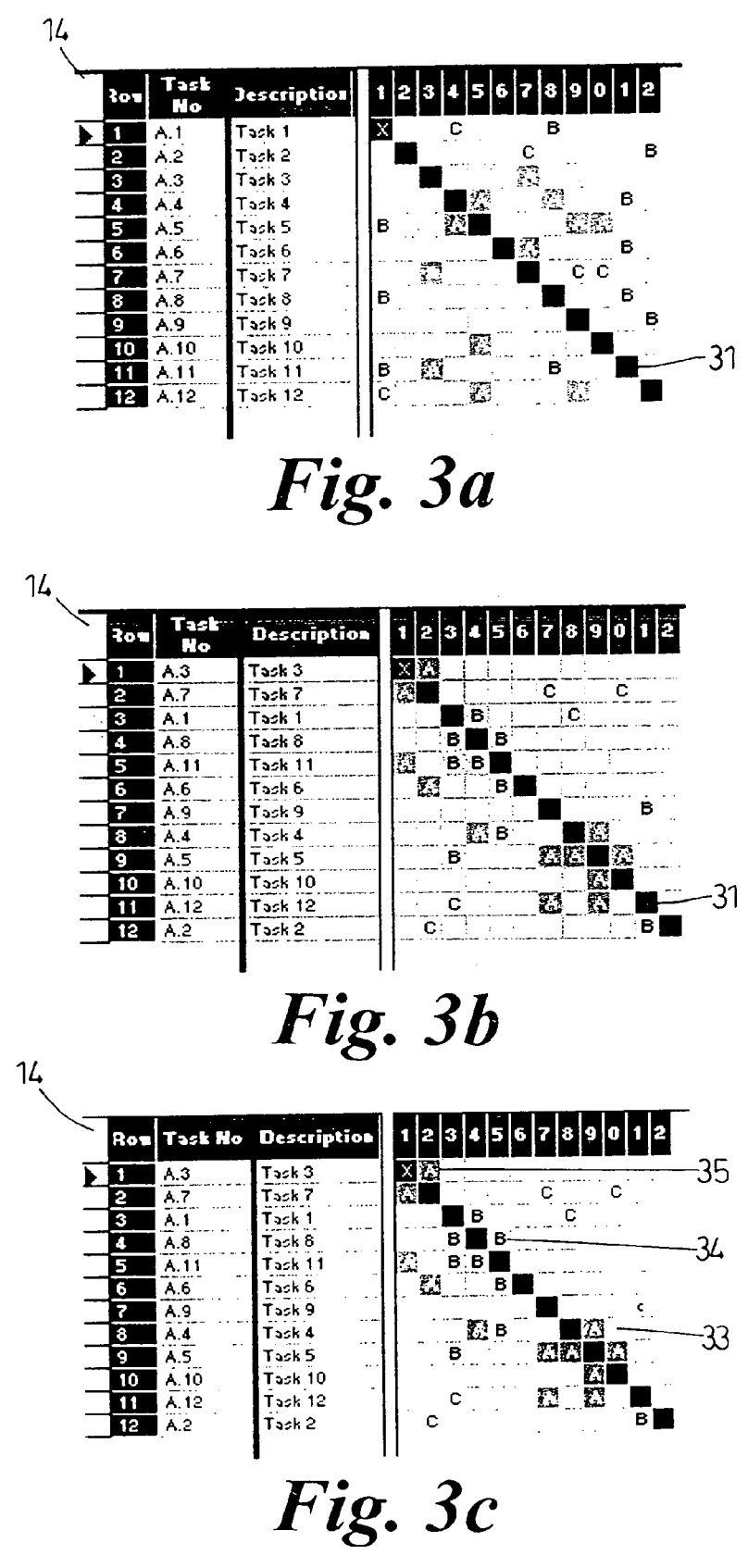

A simple example of a dependency structure matrix 14 is demonstrated in FIG. 3(a). As can be seen, the design tasks are listed arbitrarily in the rows of the matrix (for ease of understanding in this example they happen to be ordered numerically) and that order is mirrored in the columns. The DSM works on the assumption that the activities are undertaken in the order suggested by the rows (and columns, which are always in the same order). The dependence of one activity (e.g task 2) on another (e.g task 7) is indicated by placing a mark in row 2, column 7 of the matrix. In this case, the mark is a category "C", to be explained hereinafter. The excluded "self-dependency" positions of the matrix are shaded out as the black diagonal line 31.

Thus, a "mark" in the matrix 14 indicates that the activity or task on the left hand side of the matrix is dependent upon the activity at the top of the matrix. It will be understood that a mark placed below the diagonal line 31 indicates that an activity is dependent upon the information that has been produced by a previous activity, while a mark placed above the diagonal line 31 indicates that an activity is dependent upon information that has yet to be produced, ie dependence on a future activity. As a consequence, there will have to be some iterative process in the design to either resolve this future dependency, or provision of estimated information to replace that which is not yet available.

In the real world, of course, estimation of information or other dependencies for feeding forward leads to inefficiency. For example, it may be necessary to estimate the load bearing requirements of a particular structure in the building, or a quality of materials required, and this must be done by suitable overestimate to ensure safety. Estimates made can be revised later once subsequent design tasks have been carried out, but this is inefficient in the design process since it requires revisiting certain tasks and results in iterative loops in the design process.

Certain dependencies will be more critical, or harder to reliably estimate forward than others. Thus, in the dependency structure matrix 14, the dependencies are weighted on a scale (here a three point scale denoted by the letters A, B, C with A being most important) on the basis of the strength of the dependency. Factors such as the sensitivity of the receiving task to changes in the information and/or the ease with which the information can be estimated can be taken into account when indicating the strength of a dependency. If the process is undertaken in the order on the matrix from top-left to bottom-right, it is apparent that a large amount of iteration is required within the process. The size of the iteration loop is given as the size of square needed to encompass all of the dependency marks in the matrix above the diagonal 31.

It is an objective of the design process (or more generally, of a problem solving process) to minimise the number of iterations required and the size of the iteration loop. Thus, conventionally the matrix is analysed and the tasks are resequenced in such a manner as to minimise the number of future dependencies. This process is generally referred to as matrix optimisation or partitioning. Examples of partitioning algorithms are given in D V Steward, "Analysis and management: structure, strategy and design", Petrocelli Books, Princeton, N.J., USA, 1981.

FIG. 3(b) shows the matrix 14 following analysis to determine the optimal sequence of tasks, such that the need for iteration is reduced to a minimum. This corresponds to resequencing the tasks to minimise the number of dependencies above the diagonal line. It can be seen that in FIG. 3(b) the number of critical marks above the diagonal 31 has been substantially reduced and the size of iteration loop also reduced.

However, as seen in FIG. 3(b), complex problems usually result in an optimised solution that still contains too much iteration if repetitive work and abortive work are to be avoided. The crux of a full DSM analysis is therefore to also identify dependencies that can be removed or reduced in importance (often associated with fixing decisions early or making unchangeable assumptions that need not be iterated later). This can be referred to as 'declassification' of the dependencies.

FIG. 3c shows how the declassification of strong dependency (B) to weak (c) can reduce the size of an iterative loop. A good DSM analysis is required to find an appropriate set of declassifications that simplify the problem solving process and its management, whilst not over-compromising the nature of the solution. Declassification algorithms can be used to identify dependencies that, if declassified, can have a big impact on reducing the size of an iterative loop; this is sometimes referred to as 'tearing'. Examples of declassification algorithms are given in D V Steward, "Analysis and management: structure, strategy and design", Petrocelli Books, Princeton, N.J., USA, 1981. However it is often more important to use the experience and tacit knowledge of experts in the field to identify practical declassifications, and the present invention assists the user to achieve this.

Referring to FIGS. 3(b) and 3(c), it will be seen that if we declassify task 9 dependence on task 12 (column 11) from B to C, and assume that all classification C task dependencies can be made fixed decisions, eg. forward estimates, then only three small iteration loops 33, 34, 35 remain. These iteration loops are: the resolution of two "A" classifications in loop 33; the resolution of two "B" classifications in loop 34; and the resolution of one "A" classification in loop 35. The "C" classification dependencies can be ignored by forward estimates.

Figures 4, 5:
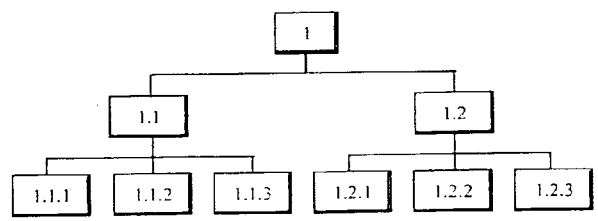
FIG. 4 shows an example of a schedule or bar chart derived from a dependency structure matrix.
FIG. 5 shows a hierarchical representation of a design process model.

In the third part of the design planning process, with reference to FIG. 4, the sequence of tasks in the optimised decision structure matrix 14 of FIG. 3c is transferred to a project management program to create a programme or bar chart 16 of the design process by the addition of resources and duration. The loops of iterative work can be programmed to ensure the design is developed efficiently and the optimal programme provides a starting point for the integration of design within the project process, an operation that may involve further analysis of the dependency structure matrix.

Scheduling the planning process in this way identifies the optimal sequence of tasks to satisfy the development of a solution. This means that the programme bar chart or schedule 16 produced in the final stage of the technique's implementation represents this optimal process. In practice, it is highly unlikely that this sequence will be realistic because of the constraints put on the process by the needs of production or construction, which often overlaps the design process.

A knowledge of the optimal design sequence, when combined with a view of the ideal production sequence (which is relatively easy to determine with the use of readily available project planning tools), provides a good starting point to integrate with a wider project process. This integration is not straightforward, as the two processes do not fit together comfortably. In order that they are integrated, the constraints that each process puts on the other must be considered. For example, foundation structures are often one of the last components to be designed in a building (ideally), but they are one of the first to be required on site which means there is usually a need to design them out of the optimal order, i.e. the construction process imposes a constraint upon design. Moving a task in the optimised DSM results in some critical dependency placed above the diagonal. In order that this does not create interdependencies within a large proportion of the design process, the dependency must be declassified (i.e. dealt with in a way that ensures it does not need to be revisited at a point later in the process, by fixing or conservatively estimating the information).

Existing computer programs have been developed that perform one or more of the three stages described above (process modelling, dependency structure matrix formulation and optimisation, and scheduling). These have significant advantages in a problem solving/planning process, but there are improvements to the technique and its automation within a computer program that can bring further important benefits, particularly when applied to very complex undertakings (i.e. those involving hundreds of tasks and thousands of dependencies, as are commonplace in large projects).

These problems are principally associated with:
1) the difficulty of finding a suitable set of declassifications in a complex problem involving perhaps hundreds of tasks and thousands of dependencies;
2) keeping a track of the history of the declassification process, e.g. for records, approval, audit and change control;
3) the effort required to set up the problem (directly in a DSM or via a process model);
4) keeping a process model and its DSM aligned if changes are made;
5) the effort required to transfer information from the DSM into a project management program to create schedules (bar charts), including dealing with the allocation of durations and resources to tasks in iterative loops;
6) keeping a DSM and its schedule(s) aligned if changes are made.

In the present invention, it has been recognised that a key aspect of resolving a complex dependency structure matrix is for the user to be able to visualise the dependency structure matrix in a hierarchical manner analogous to the hierarchical representation of the design process model 10.

A hierarchical problem comprises a number of levels with each level representing a further sub-division of those components residing within the preceding level. Thus, a single task or element at the highest level might comprise two sub-tasks or elements (representing the next level of detail), both of which also comprise three sub-tasks or elements (representing the greatest level of complexity) as shown in FIG. 5.

The key to solving complex, interdependent problems lies in being able to analyse and manipulate problems at different levels of complexity within the problem hierarchy. For example, manipulating a DSM at a lower (i.e. more detailed) level, which might comprise hundreds of tasks, is highly complex and requires a great deal of time and effort. However, if the matrix being manipulated is much smaller, corresponding to a higher level of detail (e.g., one level up), the ease of analysing the complete problem is improved. This does, however, have a disadvantage that it inherently ignores some of the dependencies lower in the system.

Figures 6A, 6B:
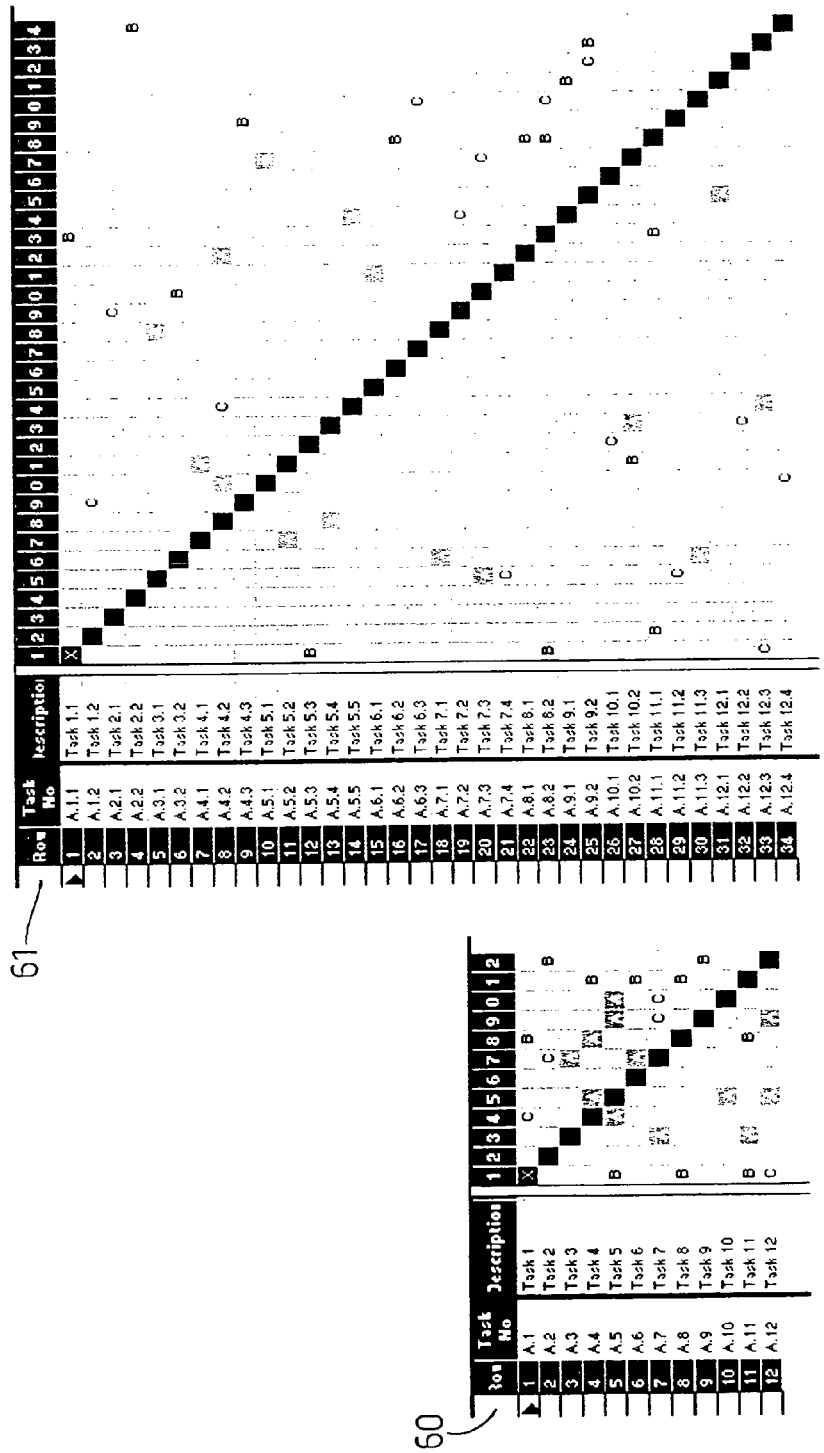
FIG. 6 shows a high level and a corresponding low level dependency structure matrix prior to optimisation.

In one aspect of the present invention, a computer-based system is provided which facilitates analysis and viewing of some or all levels of a hierarchical problem simultaneously. FIG. 6(*a*) illustrates the earlier DSM example, which represents a higher level matrix 60, together with FIG. 6(*b*) which illustrates its accompanying lower level DSM 61. The DSM 61 in FIG. 6(*b*) thus represents the sub-tasks comprised within the higher level tasks. This example shows DSM's at only two levels (termed "higher" and "lower"), but the principle applies to any number of levels, and to display of DSM's at different levels throughout the hierarchy. The two levels need not be one hierarchical level apart, but could be several hierarchical levels apart. Complex problems may well be defined in a hierarchy having five or more levels. Also, special hierarchical levels can be defined containing tasks or elements grouped at more than one level of the hierarchy in the design process model, e.g. to represent established systems of a problem. The expression "hierarchical level" of a data set used in the present specification is intended to encompass such multilevel groupings of elements of the process model.

FIGS. 6(*a*) and 6(*b*) show a high level DSM 60 and its corresponding low level DSM 61 each with an unsorted task list (ie. in arbitrary numerical order). Each high level task grouping "Task 1", "Task 2", "Task 3", etc, is listed in DSM 60 with weighted dependencies (ie. classifications) indicated, to be discussed hereinafter. Each lower level task grouping, "Task 1.1", "Task 1.2", "Task 2.1" (or individual task if this were to be the lowest hierarchical level), is listed in DSM 61 with weighted dependencies also indicated.

Figures 7A, 7B:
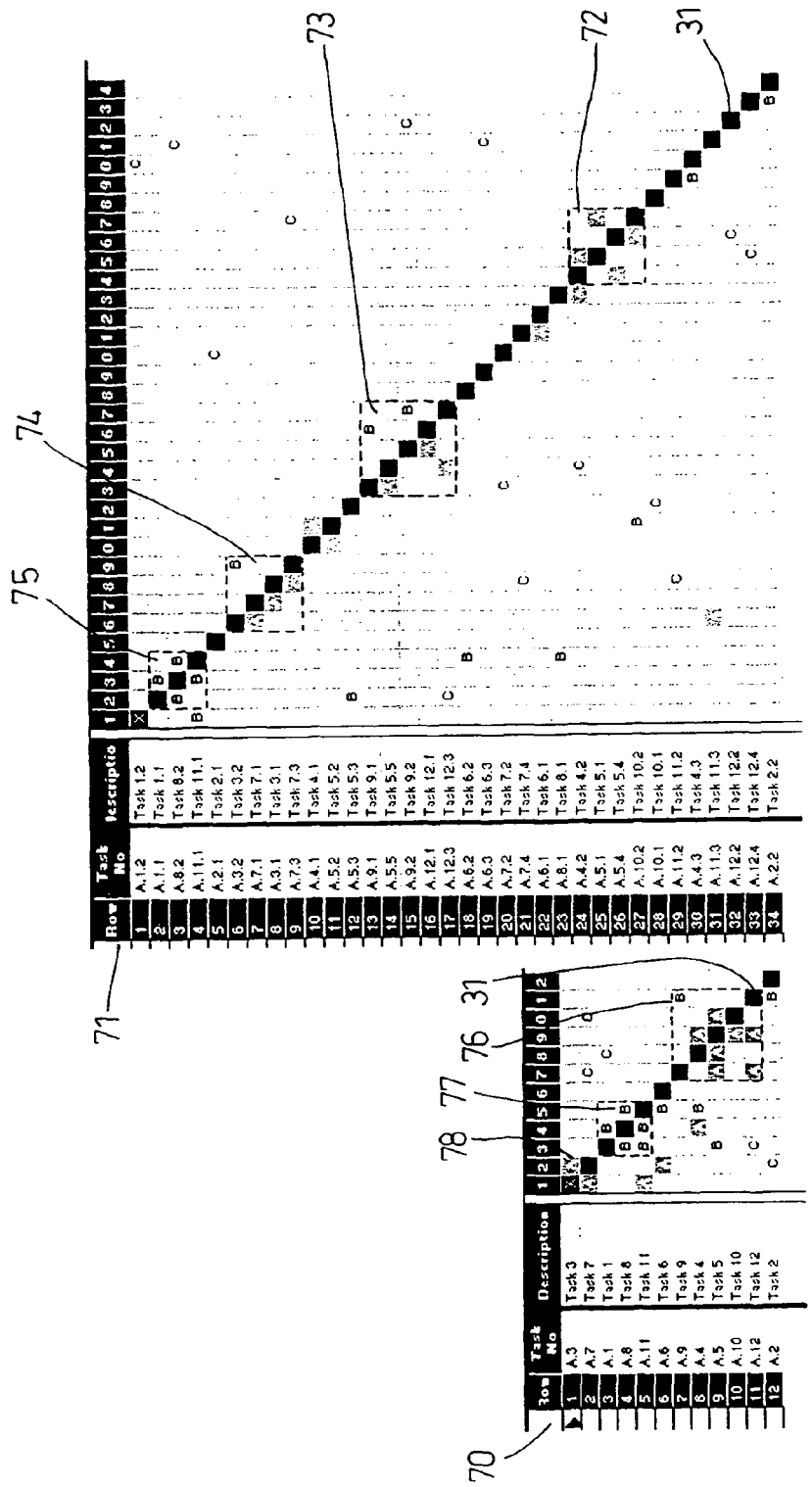
FIG. 7 shows a high level and a corresponding low level dependency structure matrix after optimisation.

FIGS. 7(*a*) and 7(*b*) show the same high level DSM 70 and its corresponding low level DSM 71, but with the low level tasks sorted or optimised to minimise the number of future dependencies, above the diagonal 31, and preferably also to ensure that as many of the strong dependencies (here termed A and B, but any lettering or numbering scale can be used) have moved below the leading diagonal. Those strong dependencies (eg. excluding "C" classification) that are left above the diagonal are shaded to represent blocks of iteration 72-75 on DSM 71, and blocks of iteration 76-78 on DSM 70.

The additional functionality of enabling all levels of a hierarchical problem to be analysed simultaneously means that the effects of matrix manipulation at one level of the hierarchy are conveyed, on the basis of a pre-defined protocol (described subsequently), to all other levels. This functionality allows the user to manipulate a matrix at the most convenient/relevant level of the hierarchy and then immediately view the effects of the changes at all other levels of the hierarchy.

Enabling the viewing of multiple dependency structure matrices at different hierarchical levels simultaneously, together with the ability to have one displayed DSM automatically updated consequent on a user input on another DSM at different hierarchical level provides a powerful tool assisting user comprehension of the significance of elements of the dependency matrix as a whole. This, in turn, provides the user with an automated tool that allows the iterations of design process to be concluded far more quickly and accurately than previously possible.

Figure 8:
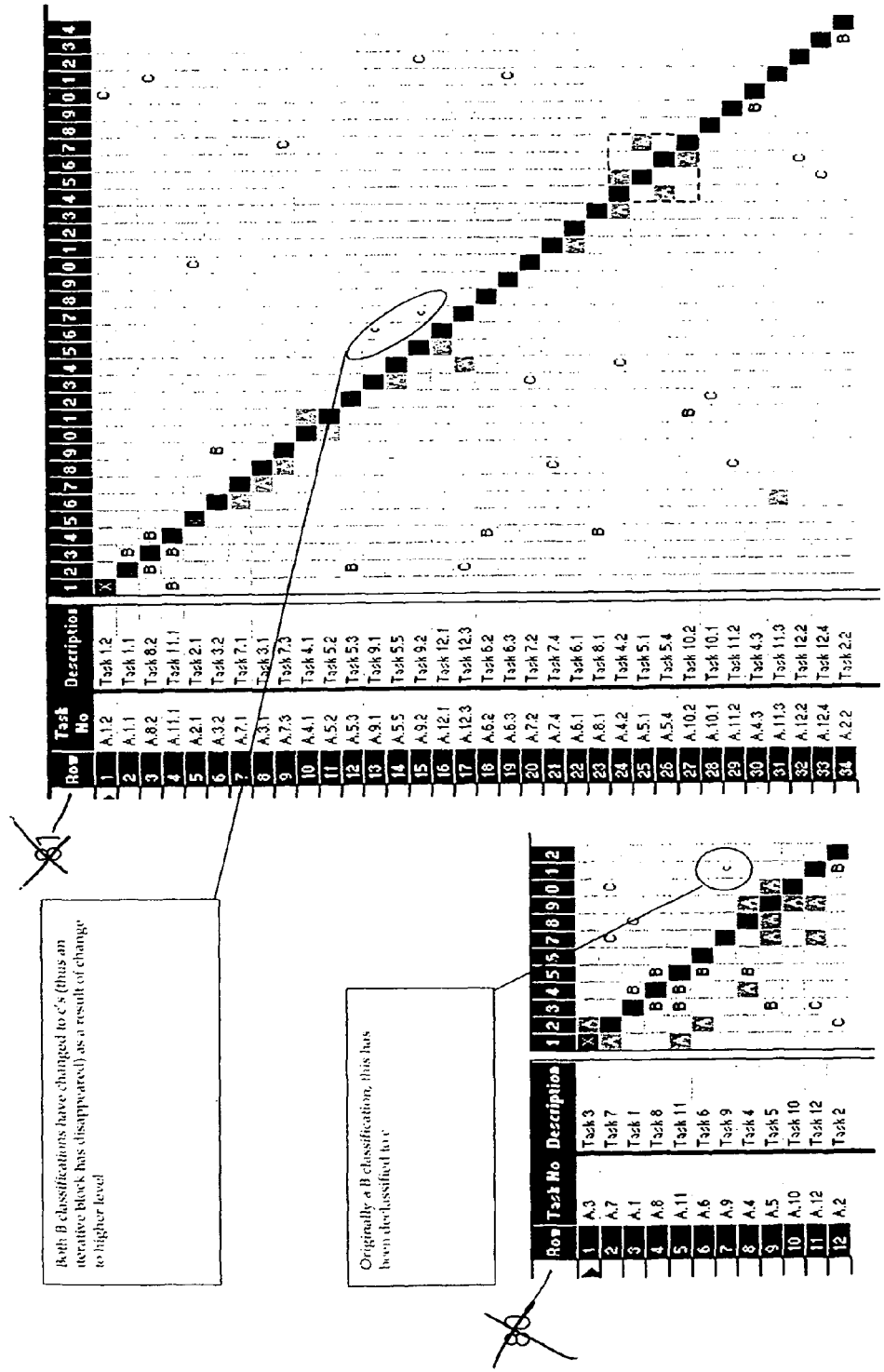
FIGS. 8, 9, 10 and 11 illustrates various effects of declassification of an activity group at higher level on lower level activities.

An example is shown in FIG. 8. The user has determined that the higher level task 9 weighted dependency "B" on higher level task 12 (column 11) shown in FIG. 7(*a*) should be downgraded to classification "C". This is reflected in FIG. 8(*a*) where a lower case letter "c" acts as a marker indicating the new, changed classification. In the lower level matrix in FIG. 8(*b*), lower level classifications have correspondingly been transformed to lower case "c"s. Other marker techniques other than lower case letters may be used to indicate the change of status.

In the present invention, when a single level is re-optimised (partitioned) after changes or declassifications have been made, the problem hierarchy is immediately displayed or displayable at all levels so that the user can readily visualise and understand the changes that have been introduced.

Thus, in one aspect of the present invention, the user is able to manipulate data in one dependency structure matrix (eg. by varying the dependency classification) and the system then effects consequential changes in all other dependencies in the data set comprising dependency structure matrices of all hierarchical levels throughout the hierarchical structure.

In order for the DSM to be resolved simultaneously at all levels, a protocol is required for establishing how a group of weighted dependencies in the lower level matrix is entered as a single weighted dependency in the higher level matrix, and for establishing how a plurality of weighted dependencies for multiple tasks is entered.

For example, a task has weighted dependencies on four other tasks, classified respectively A, B, C, C. In the preferred embodiment, the rule applied is that the group weighted dependency is based on the strongest classification in the set (i.e. an "A" in this example). Some tasks may be dependent upon only one other task, or no tasks, in which case the single dependency or no dependency is carried through to the higher level task.

Similarly, if a group of tasks at a lower level are combined at a higher level, say from DSM 71 to DSM 70, the higher level task must contain a group of dependencies. In the preferred embodiment, the rule applied is that when sets of lower level tasks (each of which may have different classifications of dependency on other tasks) are aggregated in a higher level task, the higher level task is given the highest classification within the dependencies of the sub-tasks which it comprises.

From FIG. 6, tasks 7.1 to 7.4 in DSM 61 show weighted dependency on tasks 3.1 to 3.2 of classifications "A" "A" and "C". In the higher level DSM 60, the weighted dependency of task 7 on task 3 is shown as the highest of the three classifications, "A".

Thus, more generally referring to FIG. 5, if lower level tasks 1.1.1, 1.1.2, and 1.1.3 have weighted dependencies "A", "B" and "B" respectively, the aggregate weighted dependency classification becomes "A". However, if the lower level weighted dependency classifications had been "B", "B" and "C", task 1.1 would have an aggregate weighted dependency classification of "B".

It will be understood that a number of different weighted dependency aggregation rules could be applied, depending upon the complexity of weighted dependency classifications and the environment in which they are applied.

In the preferred embodiment, the same protocol is applied when changes are made to higher level tasks. For example, if a higher level task weighted dependency is downgraded from "A" to "b", then any sub-task having a weighted dependency of "A" is automatically re-classified to a "b". Any sub-tasks already having a weighted dependency of "B" or "C" will retain their original classification in the lower level and not change. These examples are illustrated in the following FIGS. 9 and 10.

Figure 9:
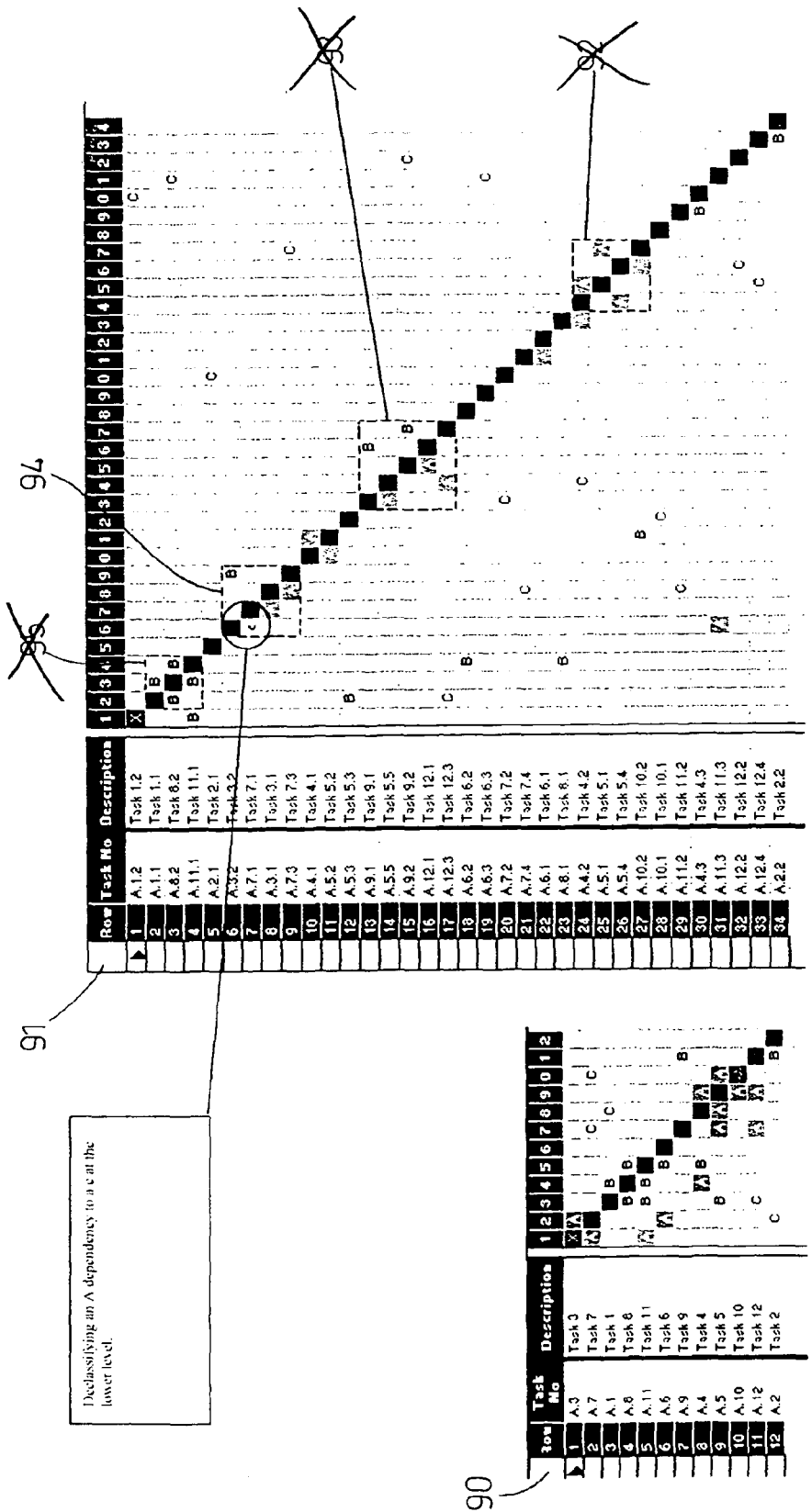
Figure 10:
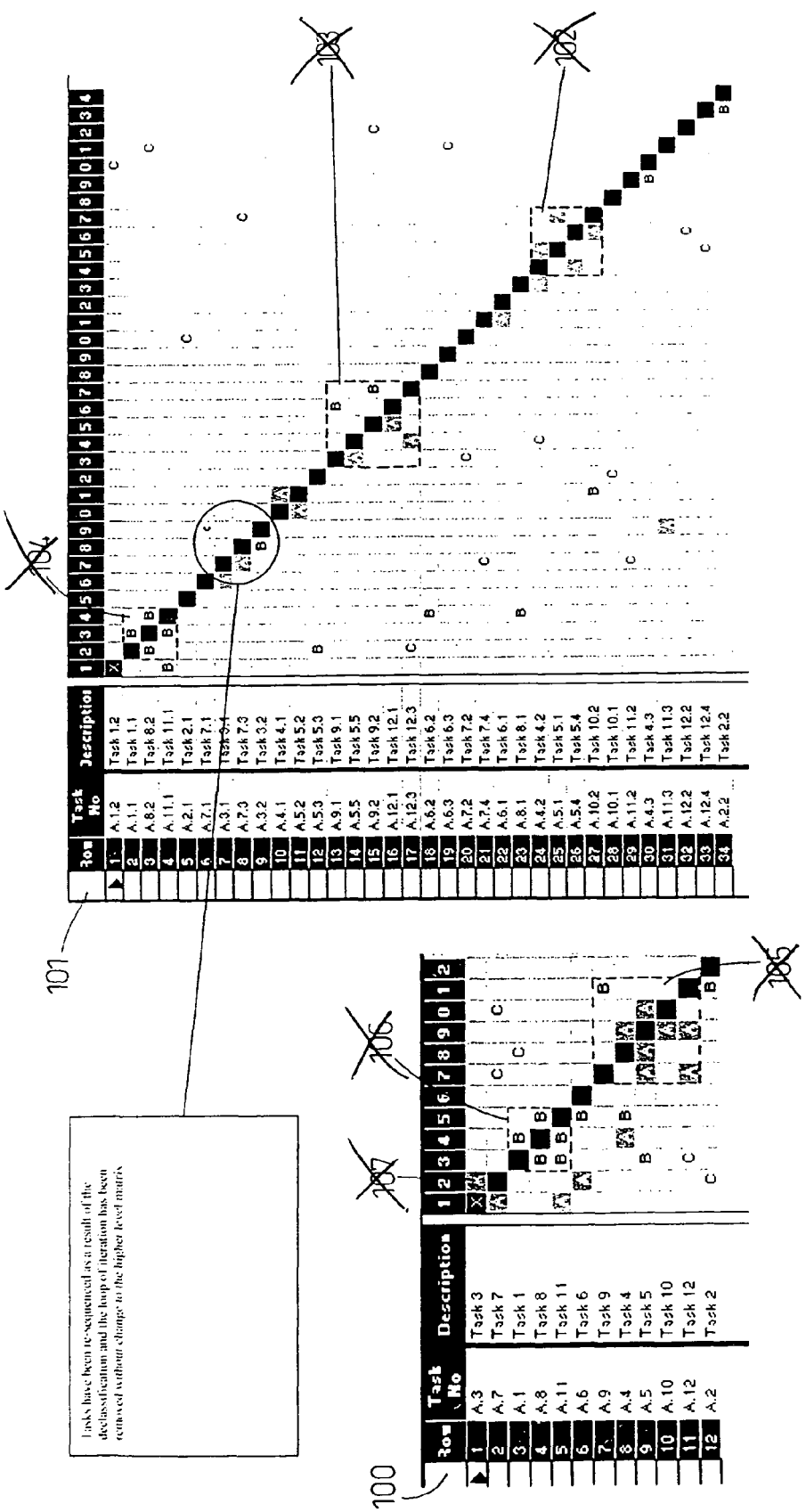

In FIG. 9, the weighted dependency of task 7.1 on task 3.2 (column 6 of DSM 91) has been declassified from "A" to "c" at the lower level. The system automatically reflects this change when the multi-level DSM's are re-analysed. In the re-optimisation of the lower level, where the tasks are resequenced to take into account the declassification, it can be seen that no change results in the corresponding re-optimisation of the higher level matrix 90. Thus, the user can immediately see that there is no effect on the higher level matrix whereas an iterative loop has been removed at the lower level. This is shown in FIG. 10, where the higher level DSM 100 still shows the same dependency classification for task 7, whereas in the lower level DSM 101, a loop of iteration (item 94 in DSM 91) has been taken out.

Figure 11:
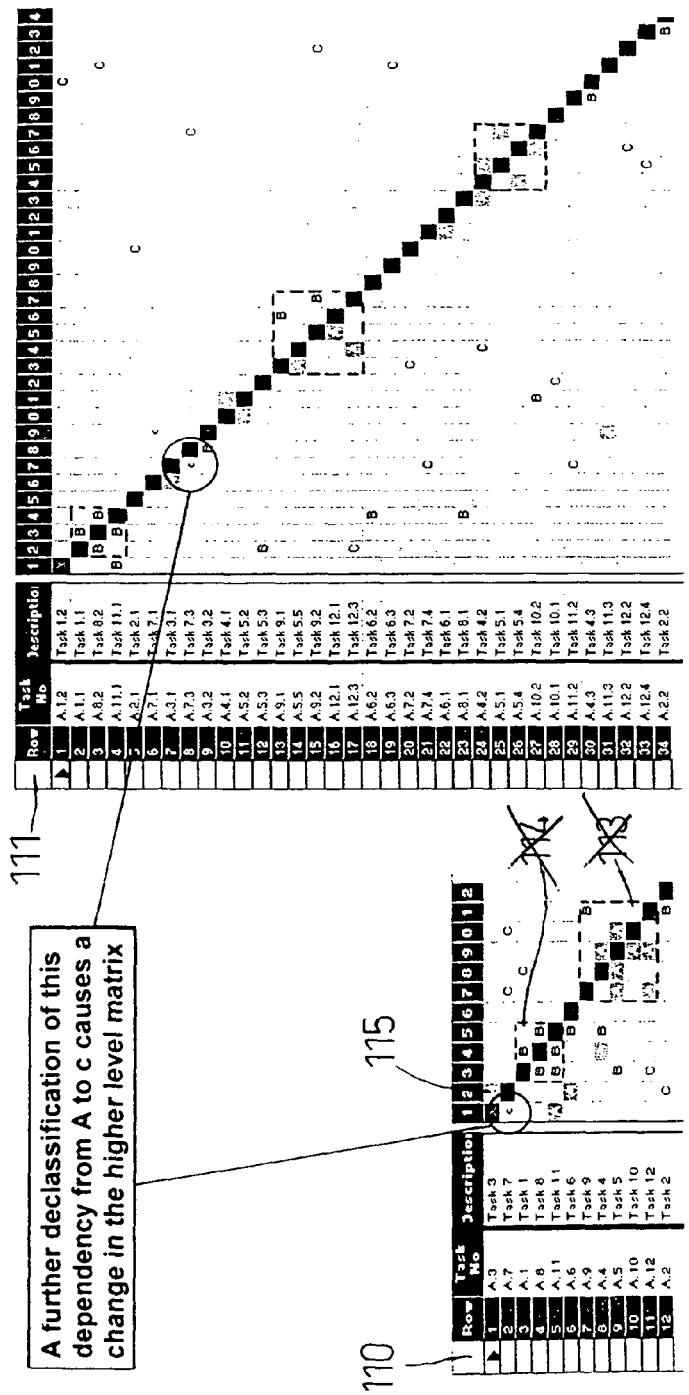

In FIG. 11, the effect of a further change in the lower level matrix 111 does have an effect on the higher level matrix 110. In this case, a declassification of the weighted dependency of task 7.3 on task 3.1 (column 7 of DSM 111) from "A" to "c" followed by re-optimisation results in removal of an iterative block 115 in the higher level matrix 110 as shown in new higher level DSM 112.

It will be understood that the higher and lower level matrices displayed may be at any combination of different hierarchical levels throughout the model, according to user selection. Thus, a user of the system can determine critical levels in the hierarchy which are most useful to a current level of analysis and display the relevant matrices for those levels while investigating the effects in one hierarchical level of making changes at another hierarchical level.

To assist the user in optimising the dependency structure matrix, preferably the system displays DSM's at both higher and lower levels, as selected by the user, simultaneously and adjacently on a computer monitor, as shown in FIGS. 6 to 11. Preferably, the system is also adapted to display many or all of the hierarchical DSM's simultaneously, if desired by the user. Alternatively, the system may be adapted to display two or more hierarchical DSM's in separate windows which may be tiled or cascaded in accordance with conventional windows-based display systems.

The system automatically makes all necessary changes at all levels of the tasks in the hierarchy to reflect a change (to a task or dependency) made at a single level.

Preferably, the system can inform the user of the nature of any dependencies (e.g. name and source task) when selected in a displayed matrix at any hierarchical level. In other words, the system can display, on demand, a detailed indication of all relevant dependencies for elements above and below the selected element, which affect the value of the dependency of the selected element. The selection of a task or element within the matrix may be effected by various techniques, such as by activation with a computer mouse, either by clicking on the task row or column header, or possibly by hovering the mouse pointer over the task header or dependency marker to open a further display window.

Preferably, the system is adapted to identify any errors in the structuring of the hierarchical data (e.g. incomplete dependencies and missing parent or child tasks arising in the process model) by searching the data set for missing data.

Preferably, the system is adapted to identify tasks or elements that are at the lowest level of the hierarchy (i.e. those with no child tasks) and highlight these to the user.

Preferably, the system is adapted to prompt the user, when making a declassification, to enter a note (e.g. explaining the reasoning/justification for the declassification) which is recorded with, for example, the date, time and author. This note is associated with the database record of the task. The existence of the note is preferably highlighted on the data structure matrix display so that the user can view the note from the matrix display (eg. by activation with the mouse) and/or it may be accessed from a file that contains all the declassification notes.

The system enables the user to view multiple levels of a hierarchical problem simultaneously by generating any number of viewing screens, each of which is constructed from a different hierarchical level or section of the data structure being analysed.

In addition to the information dependencies relating to each task, the system may also be adapted to store additional data such as the associated duration for completion and the required resource allocation for each task. The existence of this data can be highlighted on the dependency structure matrix display and it may be accessed from that display or directly from a data file.

Preferably the system may be linked with other applications such as computer aided design drawing software, so that information relating to a task may be displayed together with the DSM. For example, by selection of a task from the DSM, the system may be linked to the other application software to allow viewing of a relevant engineering drawing for that task.

More generally, as the tasks and dependencies of many problems relate to specific items of information, and this information may be linked to or reside within other applications, the system can link into, and provide access to, these other data sources so that they may be utilised as the basis of the matrix manipulation by the user.

Preferably, the program contains an 'undo' facility that can enable the data set to be manipulated and the resulting matrix representation to be viewed without having to accept the changes. The program achieves this by having a memory function that retains all data from the previous data set prior to change.

Preferably, the system can offer the user advice on which dependencies to declassify to have greatest effect in breaking down loops of interdependent tasks. The system searches the data file and identifies loops of interdependent tasks before indicating the task dependencies that, if declassified, can reduce the size of the loop of interdependency, together with an effectiveness weighting on the impact of change. This function can be performed using known "tearing" algorithms as referenced earlier.

Where the system utilises a design process model 10 to generate the dependency structure matrices, this model may be formed by creating a problem-specific model from a generic model "template" for the type of problem. The generic model template preferably contains as many possible tasks and dependencies that are common to or representative of the type of design process. The system preferably uses a "wizard" that generates a specific model automatically by asking the user a set of questions that identify which parts of the generic model are to be retained (necessary), which are to be deleted (unnecessary) and which are to be replicated (ie. which exist as multiple, similar sets of tasks). The wizard uses the logic of the model to remove or replicate all the dependencies associated with the tasks being edited.

For example a generic building design model may contain a variety of foundation types and those tasks not relevant to the specific building would be deleted following a question about foundation types. Also a building may have heating systems on alternate floors which would be duplicated following questions about the number of storeys and the HVAC (heating and ventilating and air-conditioning) strategy.

Where a dependency structure matrix is generated from a problem-specific design process model 10 (the latter being in say tabular or graphical form) as described above, the system may also be adapted to reflect changes made subsequently within the dependency structure matrices back into the design process model. So, for example, if a task or dependency is removed by editing a matrix, it would also be removed from the model representation.

Where the system is designed to produce bar chart schedules 16 of the analysed process model, that take account of the durations and resources of the tasks, this is preferably automated by a wizard which captures the durations and resources (if not already held within the system) and asks the user questions about the scheduling of loops of tasks. The latter, by their nature, contain a group of tasks that are interdependent and must be iterated to reach a solution. Either the user can enter an appropriate duration for each task or it could be calculated by the program from a predefined effort assuming no iteration, multiplied by a factor (pre set or user defined) that depends on the size of the loop (i.e. the number of co-dependent tasks).

Where a bar chart schedule 16 is generated from a dependency structure matrix 14, as described above, the system is preferably adapted to reflect changes made subsequently within the bar chart back in the matrix. So, for example, if a task is moved in time within the bar chart (say made earlier), then it will appear within the matrix in its new position, based on the new order of tasks and their dependencies.

Figure 12:
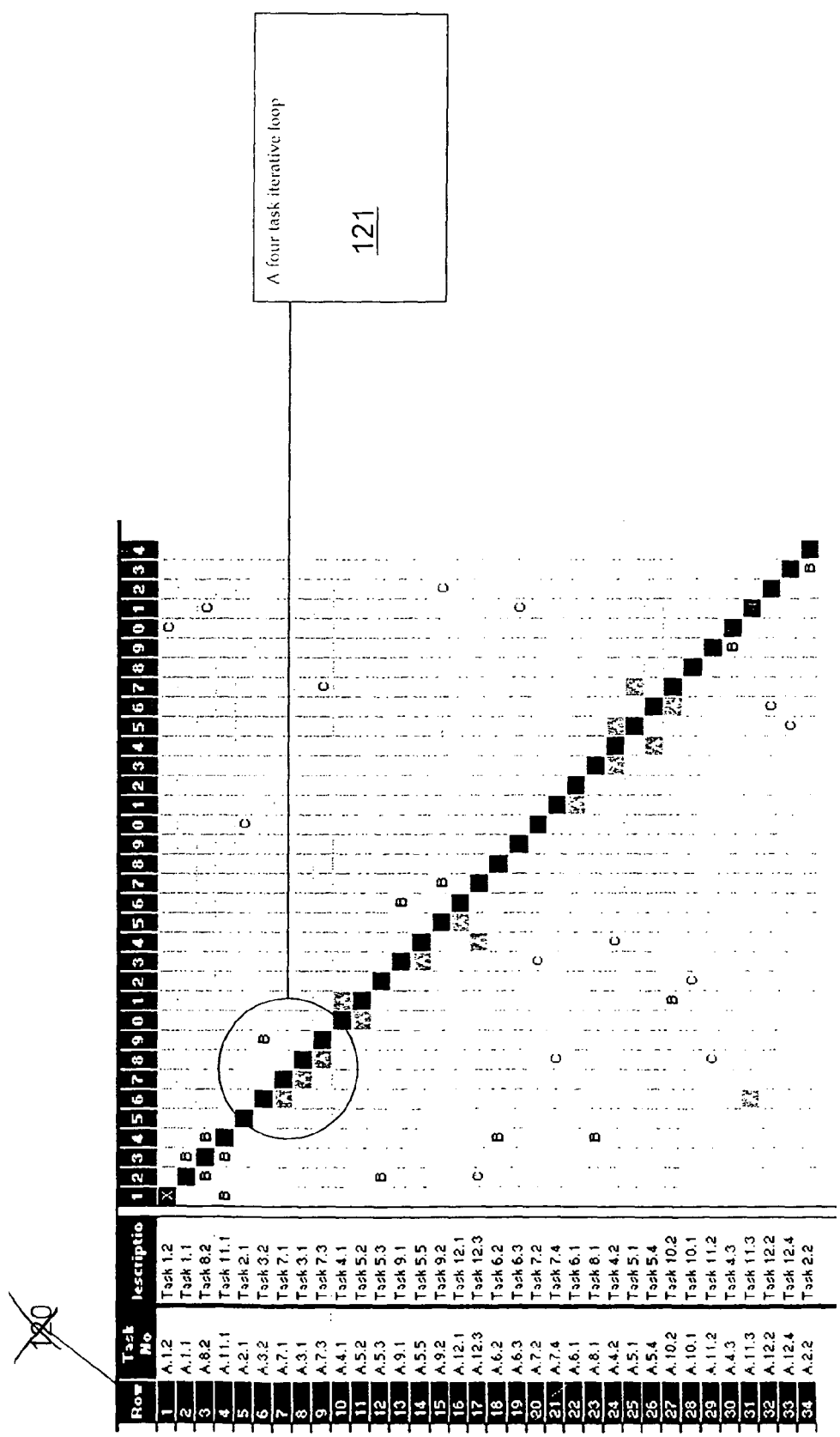
FIG. 12 shows an iterative loop in a dependency structure matrix.
Figure 13:
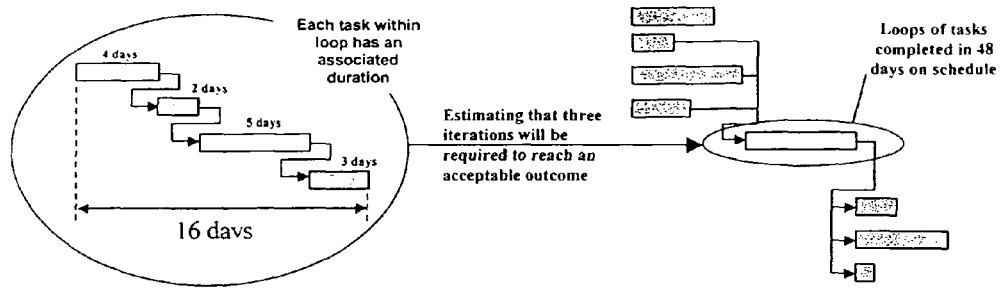
FIGS. 13 to 15 show manipulation of a portion of a schedule or bar chart derived from the iterative loop in FIG. 12.
Figure 14:
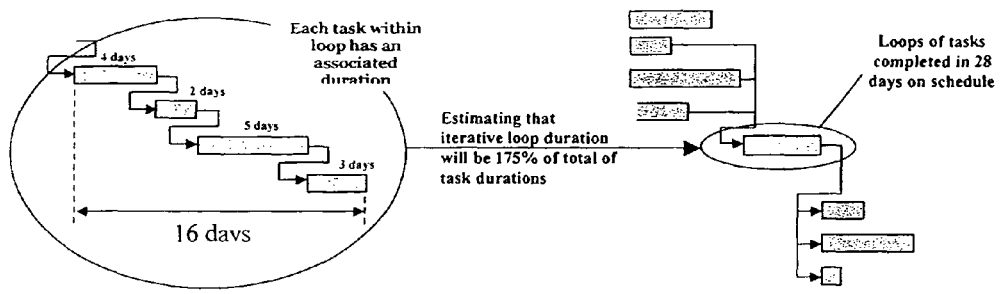
Figure 15:
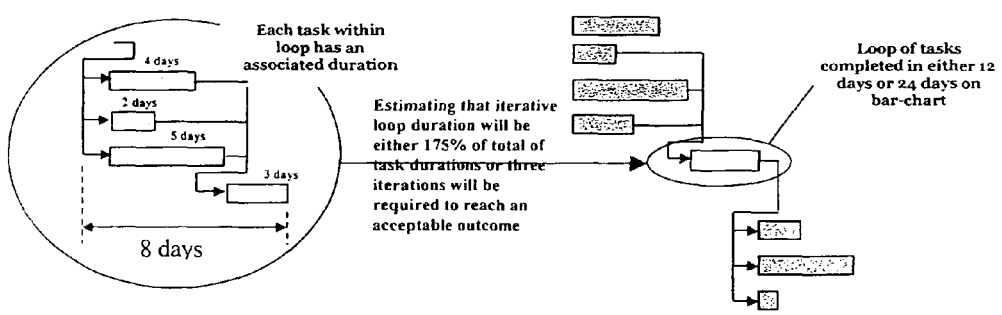

Tasks in an iterative loop can be scheduled in many ways according to an iteration protocol. For example the duration of the four task loop 121 in FIG. 12 could be calculated as:
(i) the sum total of the tasks' durations (which assumes all tasks must be undertaken in sequence) multiplied by an estimate of the number of repetitions required to reach an acceptable outcome. This is shown schematically in the bar chart schedule of FIG. 13;
(ii) the sum total of the tasks' durations multiplied by a percentage that accounts for learning and therefore reduced durations in any subsequent iteration. This is shown schematically in the bar chart schedule of FIG. 14;
(iii) the duration of the longest task (which assumes all tasks are undertaken concurrently) multiplied by a factor or percentage as in (i) or (ii) above; or
(iv) as described in (i) or (ii) above, but where the user makes a selection that differentiates between tasks within the iterative loop that can be undertaken in parallel and those that can be undertaken in series, as shown schematically in the bar chart schedule of FIG. 15.

Figure 16:
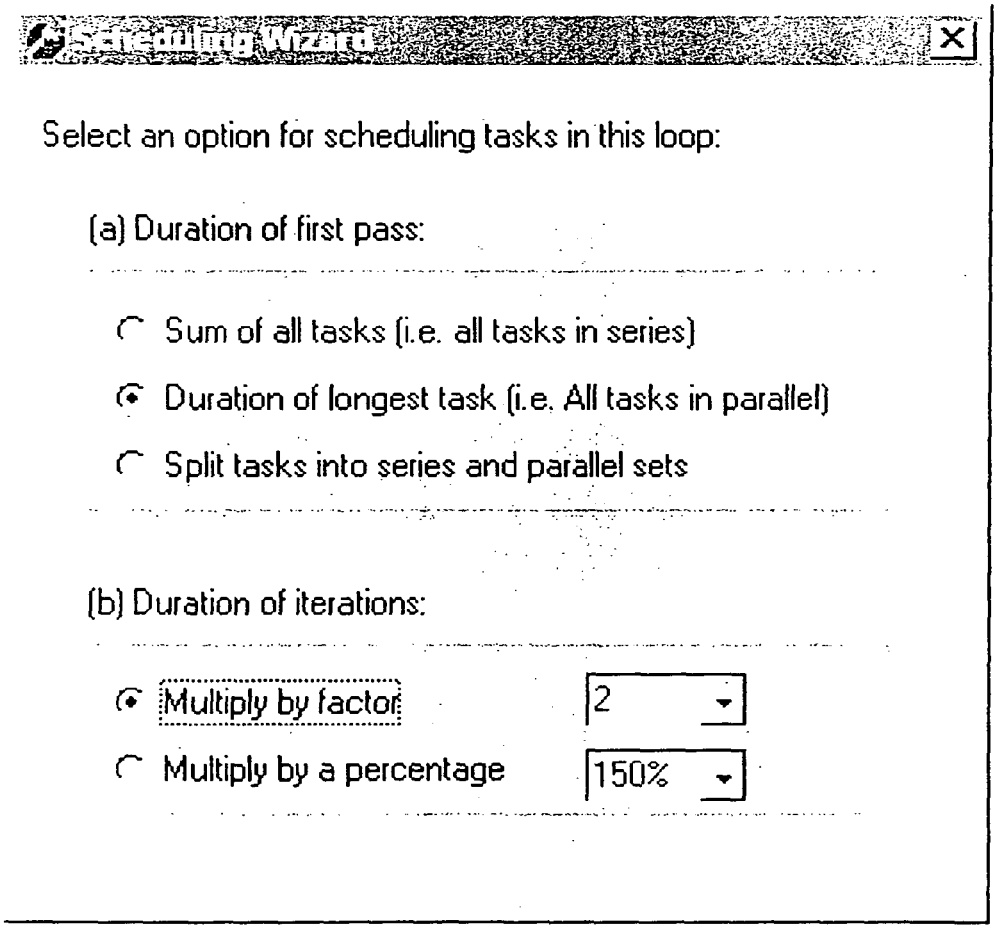
FIG. 16 shows an exemplary scheduling wizard screen display.

A program wizard can offer the user a number of pre-defined options, such as those described above, with the possibility of selecting or modifying the factors/percentages. The choice will depend on the user's interpretation of the problem and how best to execute the tasks concerned (eg. as shown in FIG. 16).

The program can also allow the user to define custom scheduling options.

Where a bar chart schedule is generated from a matrix, as described above, the program can also have the ability to reflect changes-made subsequently within the bar chart back in the matrix. So, using part of the example of the higher level matrix in FIG. 3(*c*) and associated bar chart (FIG. 4) shown again in FIG. 17 (*a-b*), if a task is moved in time within the bar chart, say made earlier as in FIG. 17(*c*), then it will appear within the matrix in its new position (see FIG. 17(*e*)), based on the new order of tasks and their dependencies.

Figures 17A, 17B:
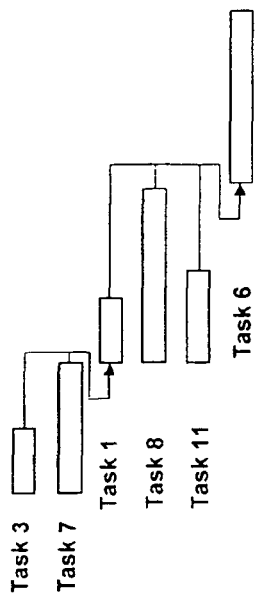
FIG. 17 shows modification of a dependency structure matrix according to manipulation of elements in a bar chart schedule.
Figure 18:
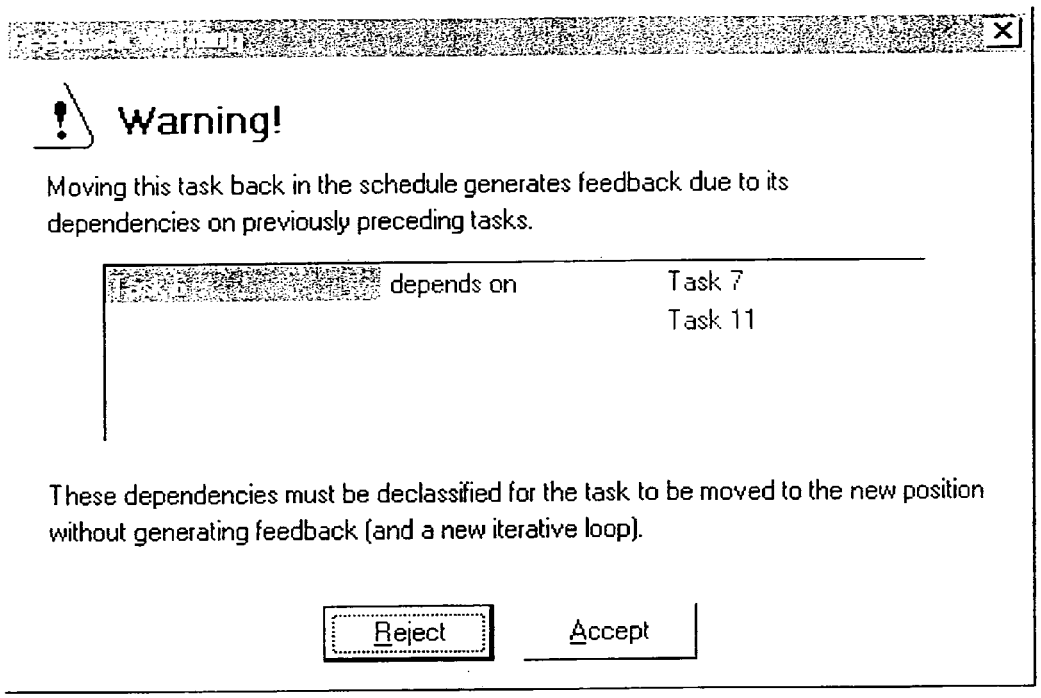
FIG. 18 shows an exemplary feedback warning screen display.

This can be achieved through the underlying file structure (for example, in the form of a database) that supports both the matrix and bar chart views. This contains all the links (both feed-forwards/successors and feedback/predecessors) between the moved activity and those affected by its move. All successor links that become predecessor links must be declassified to the lowest level (in these examples, classification "c") so that iterative loops are not created (as suggested in FIG. 17(*d*)). At this point the program can inform the user of the declassifications involved in such a move and ask for confirmation that they are acceptable, in a warning message as shown in FIG. 18. If a positive response is provided the matrix can then be automatically re-optimised to show the new position of the moved task within the matrix (and the declassified dependencies), as shown in FIG. 17(*e*). The new position in the bar chart can then be computed and displayed as shown in FIG. 17(*f*).

If, upon considering the nature of the interdependencies between tasks, it is deemed unacceptable to declassify, the user can then reconsider the move within the bar chart (or the matrix if preferred) and modify the move accordingly. In this way, the user will be able to produce best-fit schedules through consideration of both the effects of declassification and the time constraints for the problem.

In one embodiment, the database structure used to store the dependency structure matrix includes a global dependency matrix which is an amalgamation of all hierarchical matrices, and contains all of the dependency information for each hierarchical level within one data structure. Each task, sub-task, and sub-subtask down to the lowest hierarchical level is contained in the one global dependency structure matrix. Thus, the list of rows (and corresponding columns) of the stored global matrix could comprise, for example, tasks 1, 1.1, 1.1.1, 1.1.2, 1.2, 1.2.1, 1.2.2, 1.3, 1.3.1, 1.3.2, 2, 2.1, 2.1.1, 2.1.2, 2.2.1, 2.2.2, 3, 3.1, 3.1.1 etc. for a three level structure. Alternatively, the sequence could be ordered in "hierarchical" sequence, ie. 1, 2, 3, ..., 1.1, 1.2, 1.3, ..., 2.1, 2.2, 2.3, ..., 1.1.1, 1.1.2, 1.2.1, 1.2.2, 1.3.1, 1.3.2, 2.1.2, 2.2.1, 2.2.2, 3.1.1, ... etc.

The data manipulation during, for example, declassification, requires a series of matrix operators that force changes on a higher level task (row) based on the content of corresponding lower level tasks (rows), or vice versa, according to the aggregation rules described earlier. During resequencing of tasks during optimisation, the matrix may be reordered (including all hierarchical levels) by maintaining and editing a special row or column which indicates the current sequential position of a task or sub-task.

In this preferred embodiment, during display a series of display masks are imposed on the global DSM so that only selected rows and columns are displayed. For example, when viewing at the higher level, the higher level display mask may filter out all rows and columns except 1.1, 2.1, 3.1 . . . etc. At the lower level display, the lower level display mask may filter out all rows and columns except 1.1.1, 1.1.2, 1.1.3, 1.2.1, 1.2.2, 1.2.3, 1.3.1 . . . etc. As discussed previously, it is not essential that the display mask allow display of only sub-tasks at a corresponding hierarchical level. It may be desired to show third level tasks in task 1 (eg. 1.1.1, 1.1.2 etc) together with second level tasks in task 3 (eg. 3.1, 3.2, 3.3 etc).

Figure 19:
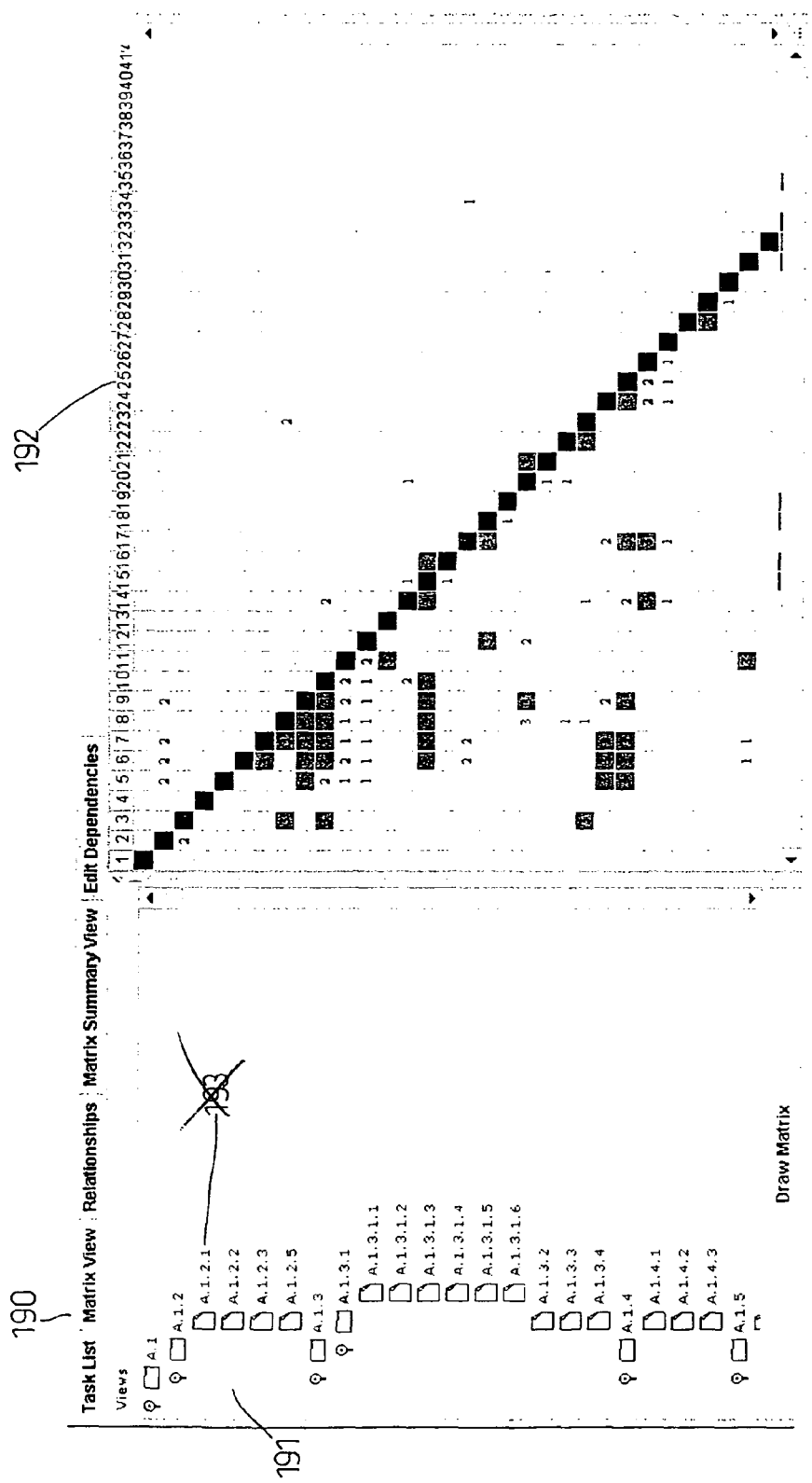
FIGS. 19 to 21 show views of exemplary viewing screens for expandable and contractible dependency structure matrices.
Figure 20:
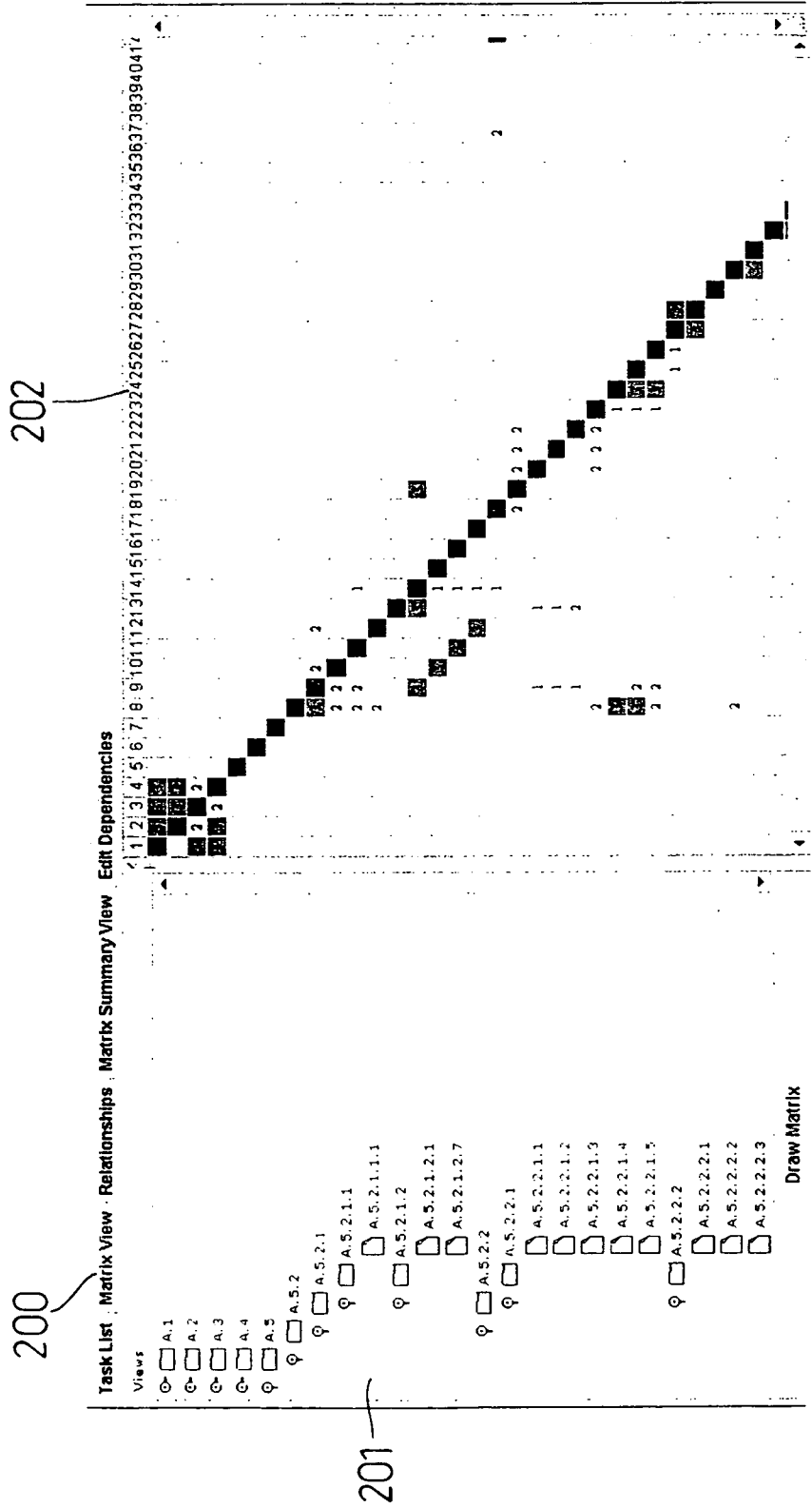
Figure 21:
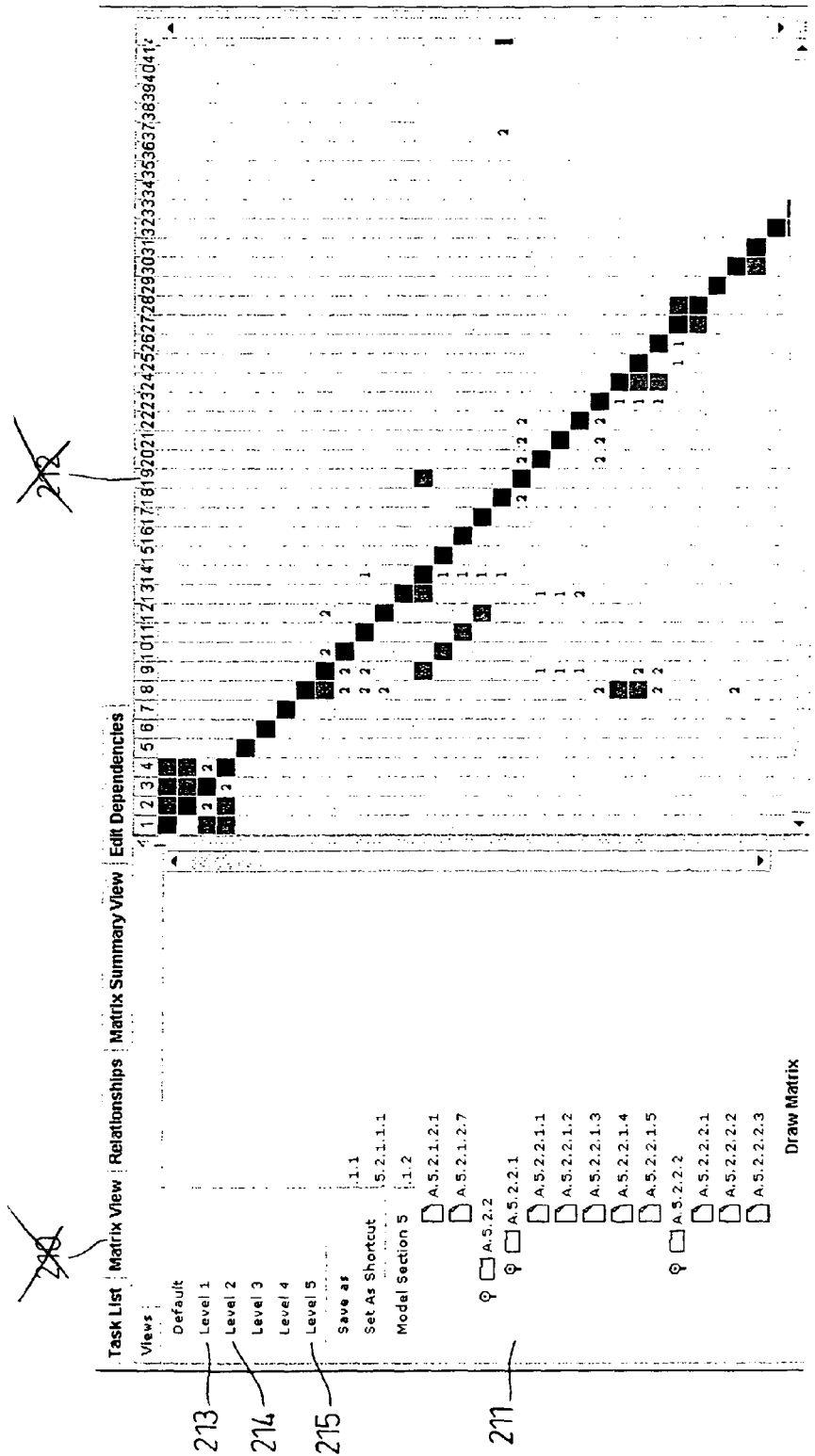

Examples of preferred multiple hierarchical level viewing screen formats are shown in FIGS. 19 to 21. In FIG. 19, a viewing screen 190 comprises a left window that identifies each task and/or sub-task in a scrollable "folder" type view, to whatever hierarchical level is desired by the user, and a right window 192 that displays the corresponding dependency structure matrix, again in scrollable form.

The preferred viewing screen format also allows the user to individually "collapse" selected sub-tasks into their respective higher level tasks. This is illustrated in FIG. 20, in which the viewing screen 200 shows the left window comprising the higher hierarchical level for tasks A1 to A4, but task A5 is expanded into the lowest hierarchical level of sub-tasks A5.2.1.1.1, A.5.2.1.2.1, A.5.2.1.2.7, A.5.2.2.1.1 . . . in a scrollable folder type view. A conventional graphical user interface device such as a mouse can be used to select tasks and subtasks for "collapse" to display only a higher hierarchical level, or expansion to display subtasks at a required lower level. The corresponding DSM is displayed in the right window 202.

Quick access view options may be provided as illustrated in FIG. 21. Here, "whole level" views may be rapidly accessed in which only tasks at level 1 are displayed using option 213, only tasks at level 2 are displayed using option 214, etc. All tasks at level 5 are displayed using option 215. The user may save certain views corresponding to selected tasks or sub-tasks comprising a mix of hierarchical levels for quick access when comparing the DSMs before and after changes. Multiple views may be open on a computer screen at any one time in a conventional tiled or overlaid window format.

The expandable/collapsible folder type views of tasks and sub-tasks is also found to be extremely useful in the declassification or tearing activities. When declassifying a dependency, eg from "A" to "c" as explained earlier, simultaneous display of lower level hierarchical tasks or information flows enables the user to see the movement of groups of named sub-tasks or information flows consequent on a declassification action.

It will be understood that the resequencing of the matrix for display may be performed in real time. In other words, the global DSM may remain in an original sequence, but be read and displayed "on-the-fly" according to the current entries in the task order identification row or column.

It will be understood that the recording of changes made to the global DSM (eg. to provide the "undo" function described earlier) can be readily achieved by simple replication of the global DSM each time a change is made.

Specific items of information relating to the design process model, DSM or bar chart schedule need not be stored in the global DSM, nor even in the same database, but could be picked up through links and/or pointers to other data structures or databases.

If, as is common, a task (or its input/output) is assigned to an individual or group of users (referred to herein as parties), then the management of the control of the problem-solving process can be improved by automatically notifying such parties electronically either when they are due to produce an (information) output (dependency) according to the schedule or when an output they need has been produced and is available to them. More generally, the system may automatically notify such parties of scheduling information in respect of tasks allocated to them. The system can have such a feature, using the task and dependency data (defined in either a matrix, process model or schedule) when the parties associated with or responsible for the production of this data are linked via a computer network or the internet.

The viewing screens described in connection with FIGS. 19 to 21 also can be used to control the application of tearing algorithms to only selected levels of the DSM, or even to selected mixes of tasks at different levels. The user can easily select a number of tasks and/or sub-tasks corresponding to one or more hierarchical levels according to the graphical user interface of FIGS. 19 to 21 by collapse and/or expansion of tasks in the left windows 191, 201, 211. This selection of tasks in multiple hierarchical levels can then be used as the controlling input for application of a tearing algorithm (as previously described) to only those displayed tasks and sub-tasks.

Figure 22:
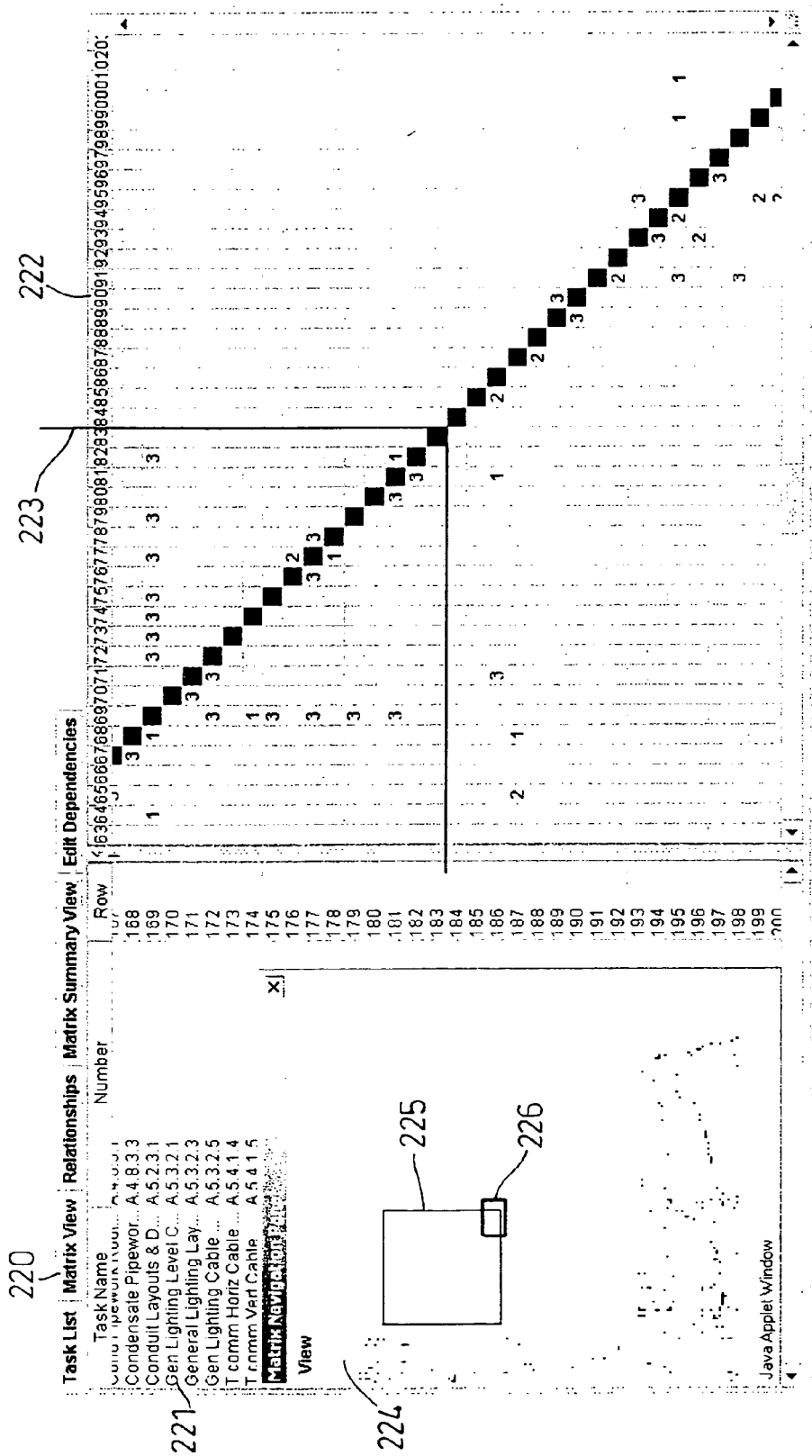

Still further, the user may conveniently use the displayed matrix to select a sub-portion thereof for the application of a tearing algorithm. In FIG. 22, a viewing screen 220 shows the right window (DSM display) having a selected portion 223 highlighted for input to a tearing algorithm. An overlay navigation panel 224 (partially covering the left window 221) displays the full extent 225 of the user selected part of the whole matrix, with box 226 indicating the extent of display window 222. The user selection can be made by conventional "click-and-drag" type operations and greatly improves the speed and accuracy of input for tearing algorithms.

Figure 23:
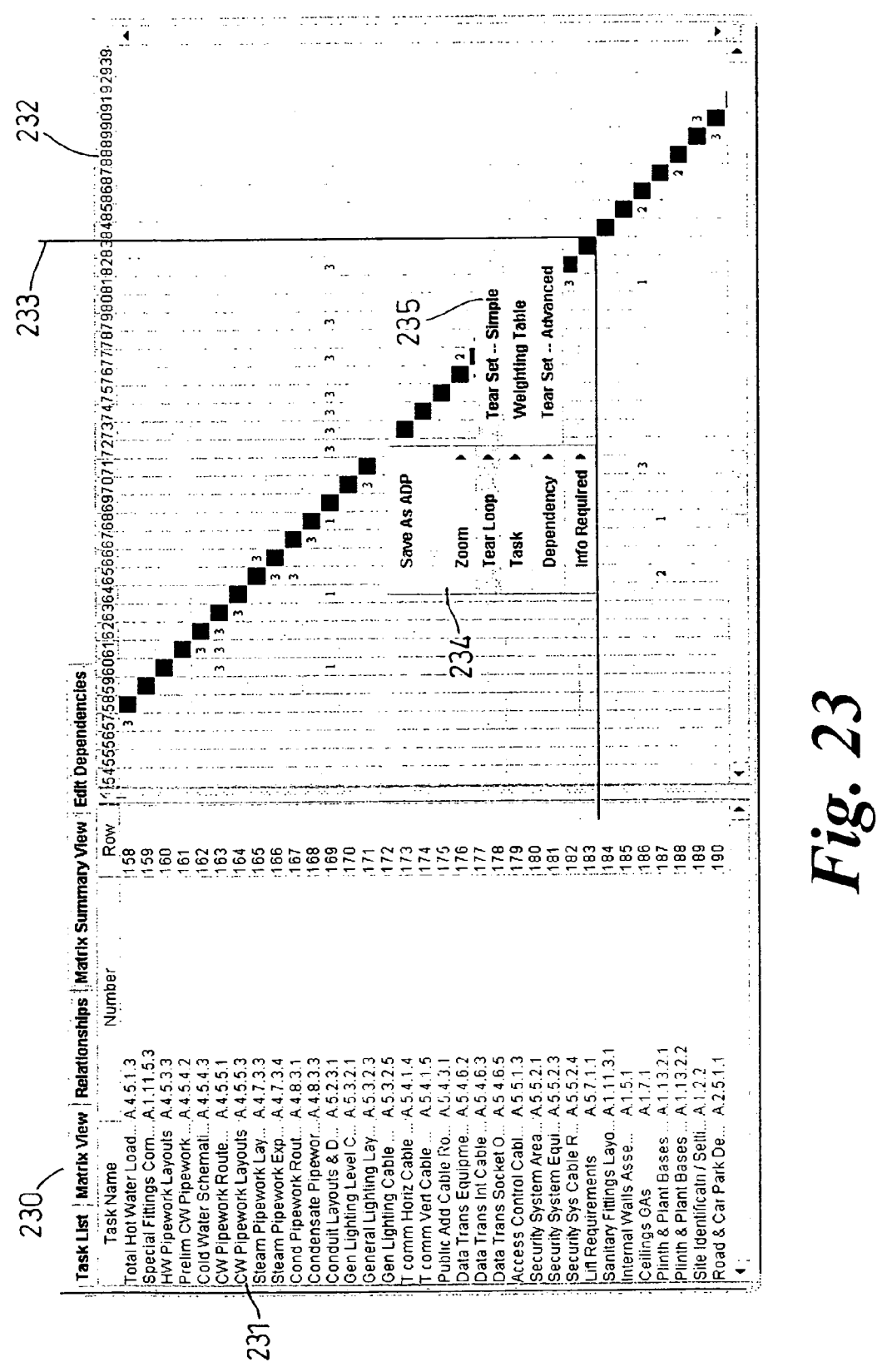

As illustrated in FIG. 23, the user may also select tearing attributes to be applied to the selected matrix portion 233 using, for example, pop-up windows 234, 235. Tearing can be applied to the selected matrix portion 233 according to elements of any selected dependency weighting (eg. "A", "B" or "C" as described earlier), even if the selected portion 233 includes higher weighting elements within it.

Figure 24:
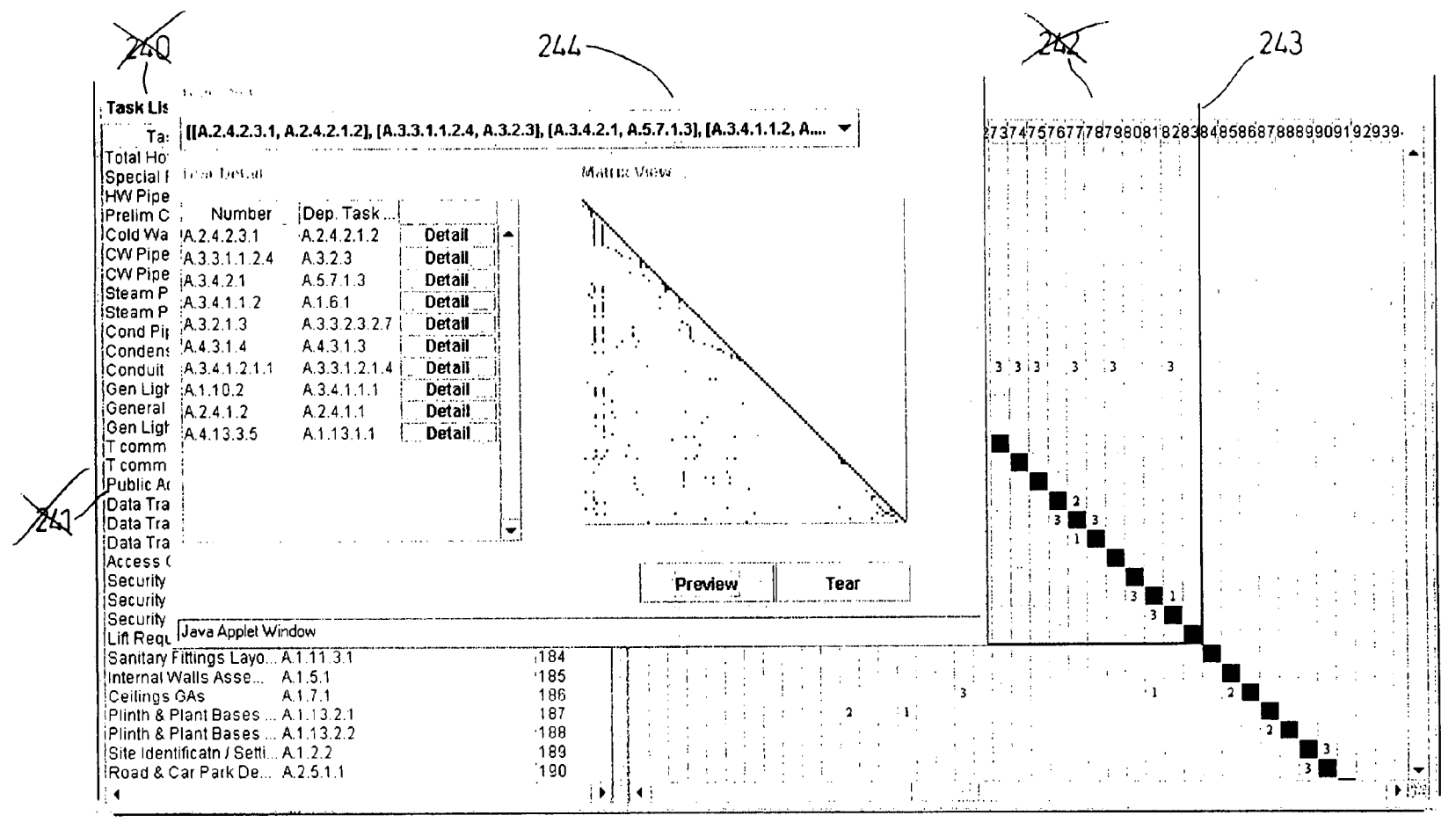

With reference to FIG. 24, a preview window 244 shows a quick view of the matrix after application of the tearing algorithm to the selected matrix portion 243, allowing the user to immediately see the effects of a tearing algorithm on the selected portion of the matrix.

It will be noted in FIGS. 19 to 24 that two possible types of view are illustrated for the left hand window of the viewing screen 190. In FIGS. 19 to 21, the left hand window displays the hierarchical "folder" type view that enables the user to expand and collapse levels to define the hierarchical elements for incorporation into the matrix. In FIGS. 22 to 24, this folder type hierarchical view is substituted for the consequential matrix row element list in sorted order. Note that this order will not generally correspond to the hierarchical folder type view order of FIGS. 19 to 21.

These tools offer powerful input and output devices for the selection of elements in the dependency structure matrices for display and application of tearing algorithms and declassification operations, together with a fast and easily comprehensible display of the consequences of those operations. These input and output devices greatly improve the speed and accuracy by which declassification operations can be carried out and considerably improve the comprehensibility of the output to the user by efficient and effective use of output device screen space.

The invention claimed is:

1. Apparatus for assisting in the optimisation of a complex, hierarchical data structure comprising a plurality of elements each having data dependency upon other elements within a hierarchy, the apparatus comprising:
   database means for maintaining a data set incorporating information relating to a plurality of dependency structure matrices corresponding to different hierarchical levels and comprised of elements, said elements comprising first-level elements occupying a first one of the hierarchical levels and second-level elements occupying a second one of the hierarchical levels lower than the first level, wherein the second-level elements comprise second-level groups individually associated with the first-level elements, with each second-level group having one or more second-level elements representing sub-tasks comprised within a task represented by the associated first-level element, said dependency structure matrices including dependency structure matrices whose elements exhibit future dependencies regardless of how the elements are sequenced, each dependency structure matrix corresponding to one of the hierarchical levels in the data set and each dependency structure matrix providing an indication of whether the data dependency of each element is dependent on information produced by an element representing an earlier, past activity or is dependent on information produced by an element representing a future activity;
   display means for displaying, to a user, a representation of said dependency structure matrices at said different hierarchical levels;
   user input means for effecting a change of a data dependency of a selected element at any selected level in said hierarchy; and
   data manipulation means, responsive to a change in data dependency of a selected element occupying a selected one of the first and second hierarchical levels, for automatically effecting changes in the data set representing changes in dependencies of elements throughout the hierarchical structure including a change in data dependency to an element associated with the selected element and occupying the one of said first and second hierarchical levels other than said selected level, consequential on the change in data dependency of said selected element at said selected level in the hierarchy;
   wherein said data manipulation means comprises means for applying a protocol for effecting changes to grouped dependencies of the second-level elements of a given one of the second-level groups consequent on a change of a dependency for the associated one of the first-level elements.

2. Apparatus according to claim 1 wherein said database means includes means for indicating a weighted dependency classification for a data dependency of one element on another.

3. Apparatus according to claim 2 wherein said weighted dependency classification comprises one of a series of classifications ranging from strong to weak, and wherein said means for effecting a change of said data dependency includes means for changing said classification or deleting said dependency.

4. Apparatus according to claim 1 wherein said data manipulation means comprises means for optimising a dependency structure matrix for a selected hierarchical level, and implementing corresponding changes to each of the other dependency structure matrices at different hierarchical levels.

5. Apparatus according to claim 1 wherein said data manipulation means comprises means for optimising a dependency structure matrix for a selected plurality of matrix elements in a plurality of hierarchical levels, and implementing corresponding changes to each of the other dependency structure matrices.

6. Apparatus according to claim 1 wherein said protocol forces a grouped dependency to assume the strongest classification of all single dependencies in the group.

7. Apparatus according to claim 1 wherein said protocol forces a declassification of all dependencies within a group of dependencies to a classification which is not higher than a group dependency.

8. Apparatus according to claim 1 wherein the data structure represents a design process model.

9. Apparatus according to claim 1 wherein the elements of said data structure each correspond to a task or activity to be carried out, or to a group of said tasks or activities, in a design or construction process.

10. Apparatus according to claim 1 wherein said display means comprises means for simultaneously displaying corresponding dependency structure matrices representative of at least two hierarchical levels of said hierarchical data structure.

11. Apparatus according to claim 1 further including means to generate said hierarchical data structure from a process model.

12. Apparatus according to claim 11 wherein said user input means includes means for enabling editing of said process model to cause said effecting of a change of a data dependency of a selected element at any level in said hierarchy.

13. Apparatus according to claim 1 further including means for generating a process bar chart or schedule from said dependency structure matrices.

14. Apparatus according to claim 13 wherein said user input means includes means for enabling editing of said process bar chart to cause said effecting of a change of a data dependency of a selected element in said hierarchy.

15. Apparatus according to claim 3 further including means for displaying to the user, in each dependency structure matrix, an indication of any consequential change in a weighted dependency classification arising as a result of a user input data dependency change implemented at one hierarchical level.

16. Apparatus according to claim 1 further including means for attaching a displayable note record in respect of each changed dependency.

17. Apparatus according to claim 1 in which said data set incorporating a plurality of dependency structure matrices comprises a global dependency structure matrix comprising entries for elements at different hierarchical levels as well as for elements at the same hierarchical levels.

18. Apparatus according to claim 17 wherein said display means includes means for masking out selected rows of said global dependency structure matrix to inhibit display thereof.

19. Apparatus according to claim 18 wherein said means for masking out selected rows comprises an expandable/collapsible folder in a graphical user interface.

20. Apparatus according to claim 1 further including means to automatically generate a process model from said data set incorporating a plurality of dependency structure matrices.

21. Apparatus according to claim 1 further including means for displaying an indication of all relevant dependencies for elements above and below a selected element which affect the value of the dependency of the selected element.

22. Apparatus according to claim 1 further including means for displaying detailed information on the nature of an element by selection of an entry corresponding to that element in a dependency structure matrix.

23. Apparatus according to claim 11 further including means for automatically identifying errors or incomplete information in the process model.

24. Apparatus according to claim 1 further including means for linking with other applications to enable display of related data to an element being displayed in a dependency structure matrix.

25. Apparatus according to claim 13 wherein at least some of said elements represent tasks to be carried out by predetermined parties, and further including means for automatically notifying said parties of scheduling information in respect of tasks allocated to them.

26. Apparatus according to claim 13 further including means for scheduling iterations of tasks in the schedule according to loops identified in the dependency structure matrix according to an iteration protocol.

27. Apparatus for assisting in the optimisation of a complex, hierarchical data structure comprising a plurality of elements each having data dependency upon other elements within a hierarchy, the apparatus comprising:

database means for storing a data set representing a plurality of said elements associated with different hierarchical levels of the hierarchical data structure, each having a data dependency upon other elements in the data structure, said elements comprising first-level elements occupying a first one of the hierarchical levels and second-level elements occupying a second one of the hierarchical levels lower than the first level, wherein the second-level elements comprise second-level groups individually associated with the first-level elements, with each second-level group having one or more second-level elements representing sub-tasks comprised within a task represented by the associated first-level element;

display means for displaying, to a user, a plurality of dependency structure matrices corresponding to the different hierarchical levels, said dependency structure matrices including dependency structure matrices whose elements exhibit future dependencies regardless of how the elements are sequenced, in which each dependency structure matrix corresponds to elements in one of the hierarchical levels in the data structure and each dependency structure matrix providing an indication of whether the data dependency of each element is dependent on information produced by an element representing an earlier, past activity or is dependent on information produced by an element representing a future activity;

data manipulation means, responsive to a change in data dependency of a selected element occupying a selected one of the first and second hierarchical levels, for automatically effecting changes in the data dependencies of elements throughout the hierarchical structure including a change in data dependency to an element associated with the selected element and occupying the one of said first and second hierarchical levels other than said selected level, consequential upon the change in data dependency of the selected element effected in a dependency structure matrix at the selected hierarchical level including means for applying a protocol for effecting changes to grouped dependencies of the second-level elements of a given one of the second-level groups consequent on the change in data dependency for the associated one of the first-level elements; and said display means displaying the effects of such changes in said plurality of displayed dependency structure matrices.

28. A method of optimising a complex, hierarchical data structure comprising a plurality of elements each having data dependency upon other elements within the hierarchical data structure, the method comprising:

using a database structure to maintain a data set incorporating information relating to a plurality of dependency structure matrices comprised of elements corresponding to different hierarchical levels, said elements comprising first-level elements occupying a first one of the hierarchical levels and second-level elements occupying a second one of the hierarchical levels lower than the first level, wherein the second-level elements comprise second-level groups individually associated with the first-level elements, with each second-level group having one or more second-level elements representing sub-tasks comprised within a task represented by the associated first-level element, each dependency structure matrix corresponding to one of the hierarchical levels in the data set, said dependency structure matrices including dependency structure matrices whose elements exhibit future dependencies regardless of how the elements are sequenced, each dependency structure matrix providing an indication of whether the data dependency of each element is dependent on information produced by an element representing an earlier, past activity or is dependent on information produced by an element representing a future activity;

using a display means to display to a user a representation of at least two of said dependency structure matrices at said different hierarchical levels including the first and second hierarchical levels;

using an input means to effect a change of a data dependency of a selected element at a selected one of the first and second levels in said hierarchy;

using a data manipulating means to automatically manipulate the data set, responsive to said change of data dependency of the selected element at the selected one of the first and second levels in said hierarchy, to effect changes in the data set representative of said changes in dependencies of elements throughout the hierarchical structure including a change in data dependency to an element associated with the selected element and occupying the one of said first and second hierarchical levels other than said selected level, consequential on the change of data dependency of the selected element at said selected level in said hierarchy, including applying a protocol for effecting changes in dependencies of elements throughout the hierarchical structure;

using the display means to display an updated representation of said at least two dependency structure matrices following said data set manipulation.

29. A method for the optimisation of a complex, hierarchical data structure comprising a plurality of elements each having data dependency upon other elements within a hierarchy, the method comprising:
   using a database structure to store a data set representing a plurality of said elements associated with different hierarchical levels of the hierarchical data structure, each having a data dependency upon other elements in the data structure, said elements comprising first-level elements occupying a first one of the hierarchical levels and second-level elements occupying a second one of the hierarchical levels lower than the first level, wherein the second-level elements comprise second-level groups individually associated with the first-level elements, with each second-level group having one or more second-level elements representing sub-tasks comprised within a task represented by the associated first-level element;
   using a display means to display, to a user, a plurality of dependency structure matrices corresponding to the different hierarchical levels in the hierarchy, in which each dependency structure matrix corresponds to elements in one of the hierarchical levels in the data structure, said dependency structure matrices including dependency structure matrices whose elements exhibit future dependencies regardless of how the elements are sequenced, and each dependency structure matrix providing an indication of whether the data dependency of each element is dependent on information produced by an element representing an earlier, past activity or is dependent on information produced by an element representing a future activity;
   using a data manipulation means to automatically manipulate the data set, responsive to said change of data dependency of the selected element at the selected one of the first and second levels in said hierarchy, to effect changes in the data dependencies of elements throughout the hierarchical structure including a change in data dependency to an element associated with the selected element and occupying the one of said first and second hierarchical levels other than said selected level, consequential on the change in data dependency of the selected one of the elements occupying the selected one of the first and second hierarchical levels including applying a protocol for effecting changes to grouped dependencies of the second-level elements of a given one of the second-level groups consequent on a change of dependency for the associated one of the first-level elements; and
   using the display means to display the effects of such changes in said plurality of displayed dependency structure matrices.

30. Apparatus for assisting in the optimisation of a complex, hierarchical data structure comprising a plurality of elements each having data dependency upon other elements within a hierarchy, the apparatus comprising:
   database means for maintaining a data set defining a dependency structure matrix of said plurality of elements at various hierarchical levels in the data structure, said elements comprising first-level elements occupying a first one of the hierarchical levels and second-level elements occupying a second one of the hierarchical levels lower than the first level, wherein the second-level elements comprise second-level groups individually associated with the first-level elements, with each second-level group having one or more second-level elements representing sub-tasks comprised within a task represented by the associated first-level element, said elements exhibiting future dependencies regardless of how they are sequenced in the dependency structure matrix, said database means comprising means for automatically applying a protocol for effecting changes to grouped dependencies of the second-level elements of a given one of the second-level groups, consequent on a change of a dependency for the associated one of the first-level elements, each dependency structure matrix providing an indication of whether the data dependency of each element is dependent on information produced by an element representing an earlier, past activity or is dependent on information produced by an element representing a future activity;
   display means for displaying, to a user, a representation of at least a selected portion of said dependency structure matrix, said selected portion comprising a plurality of elements from different ones of said hierarchical levels in the hierarchy; and
   user input means for effecting a change in the portion selected for display comprising a graphical user interface list of elements each expandable to display subordinate elements at lower levels in the hierarchy or collapsible to hide subordinate elements at lower levels in the hierarchy,
   said display means being adapted to display a selected portion of the dependency structure matrix corresponding to elements currently displayed in said graphical user interface list of elements.

31. Apparatus according to claim 30 further including means for applying a dependency declassification algorithm operation to matrix elements in the selected portion.

32. Apparatus according to claim 31 further including means for displaying a result of said declassification operation.

33. The process of claim 28 or claim 29, further comprising loading a computer program onto a computer, said program when so loaded being adapted to make the computer execute the procedure of claim 29 or claim 28.

* * * * *